(12) United States Patent
Bernheim et al.

(10) Patent No.: US 10,564,196 B2
(45) Date of Patent: Feb. 18, 2020

(54) SYSTEM AND METHOD FOR DETECTING AND LOCALIZING NON-TECHNICAL LOSSES IN AN ELECTRICAL POWER DISTRIBUTION GRID

(71) Applicants: Astrolink International LLC, Bethesda, MD (US); Dominion Energy Technologies, Inc., Richmond, VA (US)

(72) Inventors: Henrik F. Bernheim, Denver, CO (US); Jerritt H. Hansell, Boulder, CO (US); Marcia Reid Martin, Longmont, CO (US)

(73) Assignees: Astrolink International LLC, Bethesda, MD (US); Dominion Energy Technologies, Inc., Richmond, VA (US)

( * ) Notice: Subject to any disclaimer, the term of this patent is extended or adjusted under 35 U.S.C. 154(b) by 0 days.

(21) Appl. No.: 15/934,499

(22) Filed: Mar. 23, 2018

(65) Prior Publication Data
US 2018/0210018 A1    Jul. 26, 2018

Related U.S. Application Data

(63) Continuation of application No. 14/304,035, filed on Jun. 13, 2014, now Pat. No. 10,001,514.
(Continued)

(51) Int. Cl.
*G01R 22/06* (2006.01)
*G01R 19/25* (2006.01)

(52) U.S. Cl.
CPC ........ *G01R 22/066* (2013.01); *G01R 19/2513* (2013.01); *G01R 22/063* (2013.01)

(58) Field of Classification Search
CPC .... G01R 22/06; G01R 22/061; G01R 22/063; G01R 22/066; G01R 22/068; G01R 22/10;
(Continued)

(56) References Cited

U.S. PATENT DOCUMENTS 3,733,586 A    5/1973  Lusk et al.
3,911,415 A   10/1975  Whyte
(Continued)

FOREIGN PATENT DOCUMENTS

CN    101770007 A     7/2010
EP    0395495 A1     10/1990
(Continued)

OTHER PUBLICATIONS

English Machine Translation of Asao et al. JP 2003258689.*
(Continued)

*Primary Examiner* — Lee E Rodak
(74) *Attorney, Agent, or Firm* — Withrow & Terranova, PLLC

(57) ABSTRACT

A system and method for detecting theft of power in an electrical distribution grid. The system may include at least two communicating meters which form a transformer area network, a mechanism for measuring current and voltage at the meters, a mechanism for transmitting the measured current and voltage data to a data center with access to an electric grid database, and a mechanism that analyzes the transmitted data to infer unauthorized taking of electrical power.

26 Claims, 7 Drawing Sheets

Related U.S. Application Data

(60) Provisional application No. 61/834,567, filed on Jun. 13, 2013.

(58) Field of Classification Search
CPC .... G01R 11/24; G01R 11/25; G01R 19/2513; G01R 19/165; G01R 21/133; G01R 29/18; G01D 4/004; G01D 4/002; G01D 4/006; Y02B 90/246; Y02B 90/242; Y04S 20/42; Y04S 20/48; Y04S 20/322; Y04S 20/36; Y04S 20/32; H04B 2203/5433; H04B 2203/5408; H04B 2203/542; H04B 2203/5495; H04B 3/54; H04B 3/546; H04B 3/542; H02J 13/0006; H02J 13/14; H04Q 2209/60
See application file for complete search history.

(56) References Cited

U.S. PATENT DOCUMENTS

| | | |
|---|---|---|
| 3,942,170 A | 3/1976 | Whyte |
| 3,944,723 A | 3/1976 | Fong |
| 4,200,770 A | 4/1980 | Hellman et al. |
| 4,361,766 A | 11/1982 | de Montgolfier et al. |
| 4,371,867 A | 2/1983 | Gander |
| 4,568,934 A | 2/1986 | Allgood |
| 4,580,276 A | 4/1986 | Andruzzi, Jr. et al. |
| 4,633,463 A | 12/1986 | Mack |
| 4,668,934 A | 5/1987 | Shuey |
| 4,918,422 A | 4/1990 | Mak |
| 5,463,624 A | 10/1995 | Hogg et al. |
| 5,812,557 A | 9/1998 | Stewart et al. |
| 5,818,725 A | 10/1998 | McNamara et al. |
| 5,987,305 A | 11/1999 | Reitberger |
| 6,144,292 A | 11/2000 | Brown |
| 6,212,560 B1 | 4/2001 | Fairchild |
| 6,366,062 B2 | 4/2002 | Baretich et al. |
| 6,373,399 B1 | 4/2002 | Johnson et al. |
| 6,535,797 B1 | 3/2003 | Bowles et al. |
| 6,650,249 B2 | 11/2003 | Meyer et al. |
| 6,687,110 B2 | 2/2004 | Murray |
| 6,690,655 B1 | 2/2004 | Miner et al. |
| 6,747,994 B2 | 6/2004 | Oses et al. |
| 6,788,702 B1 | 9/2004 | Garcia-Luna-Aceves et al. |
| 6,961,641 B1 | 11/2005 | Forth et al. |
| 7,053,756 B2 | 5/2006 | Mollenkopf et al. |
| 7,058,524 B1 | 6/2006 | Hayes et al. |
| 7,069,117 B2 | 6/2006 | Wilson et al. |
| 7,076,378 B1 | 7/2006 | Huebner |
| 7,188,003 B2 | 3/2007 | Ransom et al. |
| 7,194,528 B1 | 3/2007 | Davidow |
| 7,236,765 B2 | 6/2007 | Bonicatto et al. |
| 7,251,570 B2 | 7/2007 | Hancock et al. |
| 7,280,931 B1 | 10/2007 | Kim et al. |
| 7,319,280 B1 | 1/2008 | Landry et al. |
| 7,323,968 B2 | 1/2008 | Iwamura |
| 7,369,579 B2 | 5/2008 | Logvinov et al. |
| 7,412,338 B2 | 8/2008 | Wynans et al. |
| 7,552,437 B2 | 6/2009 | Di Luoffo et al. |
| 7,571,028 B2 | 8/2009 | Lapinski et al. |
| 7,598,844 B2 | 10/2009 | Corcoran et al. |
| 7,701,330 B2 | 4/2010 | Iwamura |
| 7,808,128 B1 | 10/2010 | Weber, Jr. et al. |
| 7,826,538 B1 | 11/2010 | Weber, Jr. |
| 7,870,600 B2 | 1/2011 | Huotari et al. |
| 7,873,077 B2 | 1/2011 | Downey et al. |
| 7,876,717 B2 | 1/2011 | Iwamura |
| 7,948,255 B2 | 5/2011 | Shim et al. |
| 8,013,570 B2 | 9/2011 | Baxter et al. |
| 8,019,483 B2 | 9/2011 | Keefe |
| 8,050,879 B2 | 11/2011 | Koste et al. |
| 8,055,896 B2 | 11/2011 | Jin et al. |
| 8,065,099 B2 | 11/2011 | Gibala et al. |
| 8,099,479 B2 | 1/2012 | Saint-Hilaire |
| 8,207,726 B2 | 6/2012 | Vaswani et al. |
| 8,519,832 B2 | 8/2013 | Loporto et al. |
| 8,521,337 B1 | 8/2013 | Johnson |
| 8,626,462 B2 | 1/2014 | Kolwalkar et al. |
| 8,639,922 B2 | 1/2014 | Phatak |
| 8,639,992 B2 | 1/2014 | Haufe et al. |
| 8,711,995 B2 | 4/2014 | Glende |
| 8,737,555 B2 | 5/2014 | Haug et al. |
| 8,818,742 B2 | 8/2014 | Ansari |
| 8,872,667 B2 | 10/2014 | Bhageria et al. |
| 9,059,842 B2 | 6/2015 | Bernheim et al. |
| 9,287,933 B2 | 3/2016 | Yu |
| 9,380,545 B2 | 6/2016 | Martin et al. |
| 9,438,312 B2 | 9/2016 | Bernheim et al. |
| 9,641,026 B2 | 5/2017 | Boardman et al. |
| 9,654,287 B2 | 5/2017 | Zhao et al. |
| 9,768,613 B2 | 9/2017 | Taft |
| 9,847,641 B2 | 12/2017 | Capp et al. |
| 9,859,712 B2 | 1/2018 | Nishibayashi et al. |
| 9,866,012 B2 | 1/2018 | Hosny et al. |
| 9,881,470 B2 | 1/2018 | Baynes et al. |
| 9,917,442 B2 | 3/2018 | Beauregard et al. |
| 9,922,293 B2 | 3/2018 | Brooks et al. |
| 9,958,925 B2 | 5/2018 | Chapel et al. |
| 10,330,812 B1 | 6/2019 | Barnett et al. |
| 10,439,432 B2 | 10/2019 | Eckhardt et al. |
| 2001/0018561 A1 | 8/2001 | Tanida |
| 2001/0037378 A1 | 11/2001 | Hirayama |
| 2001/0055272 A1 | 12/2001 | Matsuno et al. |
| 2002/0009155 A1 | 1/2002 | Tzannes |
| 2002/0069299 A1 | 6/2002 | Rosener et al. |
| 2002/0089927 A1 | 7/2002 | Fischer et al. |
| 2003/0098671 A1 | 5/2003 | Hochgraf |
| 2003/0151491 A1 | 8/2003 | Martin et al. |
| 2004/0062267 A1 | 4/2004 | Minami et al. |
| 2004/0110044 A1 | 6/2004 | McArthur et al. |
| 2004/0160990 A1 | 8/2004 | Logvinov et al. |
| 2004/0184406 A1 | 9/2004 | Iwamura |
| 2004/0218688 A1 | 11/2004 | Santhoff et al. |
| 2004/0226621 A1 | 11/2004 | Phillips et al. |
| 2004/0227621 A1 | 11/2004 | Cope et al. |
| 2005/0005150 A1 | 1/2005 | Ballard |
| 2005/0017848 A1 | 1/2005 | Flen et al. |
| 2005/0018766 A1 | 1/2005 | Iwamura |
| 2005/0043860 A1 | 2/2005 | Petite |
| 2005/0047379 A1 | 3/2005 | Boyden et al. |
| 2005/0063422 A1 | 3/2005 | Lazar et al. |
| 2005/0144437 A1 | 6/2005 | Ransom et al. |
| 2005/0155033 A1 | 7/2005 | Luoffo et al. |
| 2005/0207079 A1 | 9/2005 | Tiller et al. |
| 2005/0253690 A1 | 11/2005 | Crenshaw et al. |
| 2005/0281326 A1 | 12/2005 | Yu |
| 2006/0071757 A1 | 4/2006 | Burghard et al. |
| 2006/0078044 A1 | 4/2006 | Morrell et al. |
| 2006/0091877 A1 | 5/2006 | Robinson et al. |
| 2006/0097573 A1 | 5/2006 | Gidge et al. |
| 2006/0152344 A1 | 7/2006 | Mowery, Jr. |
| 2006/0259199 A1 | 11/2006 | Gjerde et al. |
| 2006/0291575 A1 | 12/2006 | Berkman et al. |
| 2007/0047573 A1 | 3/2007 | Logvinov et al. |
| 2007/0076650 A1 | 4/2007 | Manjeshwar et al. |
| 2007/0100506 A1 | 5/2007 | Teichmann |
| 2007/0101438 A1 | 5/2007 | Govindarajan |
| 2007/0114987 A1 | 5/2007 | Kagan |
| 2007/0162550 A1 | 7/2007 | Rosenberg |
| 2007/0208521 A1 | 9/2007 | Petite et al. |
| 2007/0211401 A1 | 9/2007 | Mak |
| 2007/0237181 A1 | 10/2007 | Cho et al. |
| 2007/0247331 A1* | 10/2007 | Angelis ............... G01D 4/006 340/870.02 |
| 2007/0271383 A1 | 11/2007 | Kim et al. |
| 2007/0297425 A1 | 12/2007 | Chirco |
| 2008/0040479 A1 | 2/2008 | Bridge et al. |
| 2008/0057866 A1 | 3/2008 | Schwager et al. |
| 2008/0077336 A1 | 3/2008 | Fernandes |
| 2008/0109387 A1 | 5/2008 | Deaver et al. |
| 2008/0187116 A1 | 8/2008 | Reeves et al. |
| 2008/0209481 A1 | 8/2008 | Barrett |
| 2008/0219239 A1 | 9/2008 | Bell et al. |
| 2008/0273521 A1 | 11/2008 | Shao et al. |

(56) References Cited

U.S. PATENT DOCUMENTS

| | | |
|---|---|---|
| 2008/0312851 A1 | 12/2008 | Kagan et al. |
| 2009/0027061 A1 | 1/2009 | Curt et al. |
| 2009/0060060 A1 | 3/2009 | Stadelmeier et al. |
| 2009/0088907 A1 | 4/2009 | Lewis et al. |
| 2009/0096416 A1 | 4/2009 | Tonewaga et al. |
| 2009/0125351 A1 | 5/2009 | Davis, Jr. et al. |
| 2009/0134699 A1 | 5/2009 | Choi et al. |
| 2009/0187344 A1 | 7/2009 | Brancaccio et al. |
| 2009/0210197 A1 | 8/2009 | Cleary |
| 2009/0219932 A1 | 9/2009 | Kobayashi |
| 2009/0238252 A1 | 9/2009 | Shah et al. |
| 2009/0240504 A1 | 9/2009 | Pang et al. |
| 2009/0243838 A1 | 10/2009 | Jones |
| 2009/0256686 A1 | 10/2009 | Abbot et al. |
| 2009/0304101 A1 | 12/2009 | LoPorto et al. |
| 2010/0005273 A1 | 1/2010 | Lee et al. |
| 2010/0007219 A1 | 1/2010 | de Buda et al. |
| 2010/0007336 A1 | 1/2010 | de Buda |
| 2010/0010857 A1 | 1/2010 | Fadell |
| 2010/0040068 A1 | 2/2010 | Wimmer |
| 2010/0054349 A1 | 3/2010 | Spencer |
| 2010/0061433 A1 | 3/2010 | Stadelmeier et al. |
| 2010/0134089 A1 | 6/2010 | Uram et al. |
| 2010/0141392 A1 | 6/2010 | Jo et al. |
| 2010/0180144 A1 | 7/2010 | Groseclose, Jr. et al. |
| 2010/0188260 A1 | 7/2010 | Cornwall et al. |
| 2010/0202471 A1 | 8/2010 | Maki |
| 2010/0217549 A1 | 8/2010 | Galvin et al. |
| 2010/0217550 A1 | 8/2010 | Crabtree et al. |
| 2010/0262313 A1 | 10/2010 | Chambers et al. |
| 2010/0262393 A1 | 10/2010 | Sharma et al. |
| 2010/0286840 A1 | 11/2010 | Powell et al. |
| 2010/0296560 A1 | 11/2010 | Sadan et al. |
| 2010/0296590 A1 | 11/2010 | Takasu |
| 2010/0306533 A1 | 12/2010 | Phatak |
| 2011/0026621 A1 | 2/2011 | Kim et al. |
| 2011/0035073 A1 | 2/2011 | Ozog |
| 2011/0040419 A1 | 2/2011 | Kogler et al. |
| 2011/0040803 A1 | 2/2011 | Pasquero et al. |
| 2011/0043340 A1 | 2/2011 | Kim et al. |
| 2011/0103429 A1 | 5/2011 | Tanaka et al. |
| 2011/0106321 A1 | 5/2011 | Cherian et al. |
| 2011/0109320 A1 | 5/2011 | Curt et al. |
| 2011/0118888 A1 | 5/2011 | White, II |
| 2011/0121654 A1 | 5/2011 | Recker et al. |
| 2011/0122798 A1 | 5/2011 | Hughes et al. |
| 2011/0130991 A1 | 6/2011 | Koste et al. |
| 2011/0130992 A1 | 6/2011 | Kolwalkar et al. |
| 2011/0133655 A1 | 6/2011 | Recker et al. |
| 2011/0140911 A1 | 6/2011 | Pant et al. |
| 2011/0196546 A1 | 8/2011 | Muller et al. |
| 2011/0208468 A1 | 8/2011 | Yamamoto et al. |
| 2011/0212700 A1 | 9/2011 | Petite |
| 2011/0216747 A1 | 9/2011 | Shao et al. |
| 2011/0224935 A1 | 9/2011 | Hampel et al. |
| 2011/0267202 A1 | 11/2011 | Efthymiou et al. |
| 2011/0282508 A1 | 11/2011 | Goutard et al. |
| 2011/0285382 A1 | 11/2011 | Kolwalkar et al. |
| 2012/0020395 A1 | 1/2012 | Domanovitz et al. |
| 2012/0026908 A1 | 2/2012 | Tzannes et al. |
| 2012/0036250 A1* | 2/2012 | Vaswani ............... G01D 4/004 |
| | | 709/224 |
| 2012/0041696 A1 | 2/2012 | Sanderford, Jr. et al. |
| 2012/0052870 A1 | 3/2012 | Habicher |
| 2012/0062210 A1 | 3/2012 | Veillette |
| 2012/0062390 A1 | 3/2012 | Solomon |
| 2012/0068784 A1 | 3/2012 | Varadarajan et al. |
| 2012/0075099 A1 | 3/2012 | Brown |
| 2012/0086459 A1 | 4/2012 | Kim |
| 2012/0123606 A1 | 5/2012 | Mollenkopf et al. |
| 2012/0128080 A1 | 5/2012 | Woo et al. |
| 2012/0136500 A1 | 5/2012 | Hughes |
| 2012/0137126 A1 | 5/2012 | Matsuoka et al. |
| 2012/0139554 A1 | 6/2012 | Parsons |
| 2012/0155557 A1 | 6/2012 | Bush et al. |
| 2012/0158329 A1 | 6/2012 | Hurri et al. |
| 2012/0185838 A1 | 7/2012 | Schwartzman et al. |
| 2012/0195355 A1 | 8/2012 | El-Essawy et al. |
| 2012/0201145 A1* | 8/2012 | Ree .................. H04W 40/246 |
| | | 370/245 |
| 2012/0201155 A1 | 8/2012 | Du et al. |
| 2012/0223840 A1 | 9/2012 | Guymon et al. |
| 2012/0232915 A1 | 9/2012 | Bromberger |
| 2012/0236879 A1 | 9/2012 | Oksman et al. |
| 2012/0242499 A1 | 9/2012 | Ree |
| 2012/0245869 A1 | 9/2012 | Ansari |
| 2012/0250864 A1 | 10/2012 | Nishibayashi et al. |
| 2012/0262355 A1 | 10/2012 | He et al. |
| 2012/0265355 A1 | 10/2012 | Bernheim et al. |
| 2012/0266209 A1 | 10/2012 | Gooding et al. |
| 2012/0275084 A1 | 11/2012 | Familiant et al. |
| 2012/0275526 A1 | 11/2012 | Hughes |
| 2012/0280565 A1 | 11/2012 | Logvinov |
| 2012/0294342 A1 | 11/2012 | Schneider et al. |
| 2012/0307646 A1 | 12/2012 | Xia et al. |
| 2012/0310424 A1 | 12/2012 | Taft |
| 2012/0310558 A1 | 12/2012 | Taft |
| 2012/0313620 A1 | 12/2012 | Swarztrauber et al. |
| 2012/0314782 A1 | 12/2012 | Boivin et al. |
| 2012/0314868 A1 | 12/2012 | Bernheim et al. |
| 2012/0316696 A1 | 12/2012 | Boardman et al. |
| 2012/0323388 A1 | 12/2012 | Littrell et al. |
| 2012/0327989 A1 | 12/2012 | Zhang et al. |
| 2013/0013232 A1 | 1/2013 | Parwal et al. |
| 2013/0031201 A1 | 1/2013 | Kagan et al. |
| 2013/0034086 A1 | 2/2013 | Martin et al. |
| 2013/0063273 A1 | 3/2013 | Bhageria et al. |
| 2013/0067253 A1 | 3/2013 | Tsuda |
| 2013/0121157 A1 | 5/2013 | Logvinov et al. |
| 2013/0132555 A1 | 5/2013 | Wang et al. |
| 2013/0151177 A1 | 6/2013 | Hughes |
| 2013/0193767 A1 | 8/2013 | Carralero et al. |
| 2013/0194975 A1 | 8/2013 | Vedantham et al. |
| 2013/0204450 A1 | 8/2013 | Kagan et al. |
| 2013/0257452 A1 | 10/2013 | DeLeo et al. |
| 2014/0035372 A1 | 2/2014 | Normoyle et al. |
| 2014/0062719 A1 | 3/2014 | Rowitch |
| 2014/0105313 A1 | 4/2014 | Kim et al. |
| 2014/0118163 A1 | 5/2014 | Li et al. |
| 2014/0125125 A1 | 5/2014 | Wyatt |
| 2014/0140358 A1 | 5/2014 | Kim et al. |
| 2014/0167735 A1* | 6/2014 | Beroset ............... G01R 29/18 |
| | | 324/86 |
| 2014/0172723 A1 | 6/2014 | Borisov et al. |
| 2014/0191568 A1 | 7/2014 | Partovi |
| 2014/0233620 A1 | 8/2014 | Bernheim et al. |
| 2014/0233662 A1 | 8/2014 | Hansell et al. |
| 2014/0236365 A1 | 8/2014 | Martin et al. |
| 2014/0236366 A1 | 8/2014 | Livadaras et al. |
| 2014/0236506 A1 | 8/2014 | Nikovski et al. |
| 2014/0300210 A1* | 10/2014 | Abi-Ackel ............... H04Q 9/00 |
| | | 307/130 |
| 2014/0359595 A1 | 12/2014 | Sehgal et al. |
| 2014/0361907 A1 | 12/2014 | Bernheim et al. |
| 2014/0368189 A1 | 12/2014 | Bernheim et al. |
| 2015/0010093 A1 | 1/2015 | Hansell et al. |
| 2015/0241488 A1* | 8/2015 | Sonderegger ........ G01R 22/066 |
| | | 702/65 |
| 2015/0316620 A1 | 11/2015 | Luan et al. |
| 2015/0323582 A1 | 11/2015 | Pigeon |
| 2016/0112378 A1 | 4/2016 | Bernheim et al. |
| 2016/0124421 A1 | 5/2016 | Hansell et al. |
| 2016/0127242 A1 | 5/2016 | Bernheim et al. |
| 2016/0164287 A1 | 6/2016 | Bernheim |
| 2016/0204991 A1 | 7/2016 | Martin et al. |
| 2016/0285511 A1 | 9/2016 | Hansell et al. |
| 2016/0302238 A1 | 10/2016 | Martin et al. |
| 2017/0344047 A1 | 11/2017 | Cioraca et al. |

FOREIGN PATENT DOCUMENTS

| | | |
|---|---|---|
| EP | 0629098 A2 | 12/1994 |
| EP | 1901145 A2 | 3/2008 |

(56) References Cited

FOREIGN PATENT DOCUMENTS

| | | | |
|---|---|---|---|
| EP | 233043 | A1 | 6/2011 |
| EP | 2566125 | A1 | 3/2013 |
| EP | 3116084 | A1 | 1/2017 |
| JP | H01106652 | A | 4/1989 |
| JP | H09501766 | A | 2/1997 |
| JP | 2003258689 | * | 9/2003 |
| JP | 2003258689 | A | 9/2003 |
| JP | 2003259696 | A | 9/2003 |
| JP | 2003339120 | A | 11/2003 |
| JP | 2004015840 | A | 1/2004 |
| JP | 2004147063 | A | 5/2004 |
| JP | 2005252671 | A | 9/2005 |
| JP | 2006262570 | A | 9/2006 |
| JP | 2007185083 | A | 7/2007 |
| JP | 2008508781 | A1 | 3/2008 |
| JP | 2008098812 | A | 4/2008 |
| JP | 2008124859 | A | 5/2008 |
| JP | 2010156694 | A | 7/2010 |
| JP | 2010161923 | A | 7/2010 |
| JP | 2010533843 | A | 10/2010 |
| JP | 2010268121 | A | 11/2010 |
| JP | 2011525787 | A | 9/2011 |
| JP | 2012227928 | A | 11/2012 |
| JP | 2012235457 | A | 11/2012 |
| JP | 2013005718 | A1 | 1/2013 |
| JP | 2013106255 | A | 5/2013 |
| WO | 9501030 | A1 | 1/1995 |
| WO | 9806187 | A1 | 2/1998 |
| WO | 2009067250 | A1 | 5/2009 |
| WO | 2010027421 | A2 | 3/2010 |
| WO | 2010141859 | A1 | 12/2010 |
| WO | 2013006273 | A2 | 1/2013 |
| WO | 2013013162 | A2 | 1/2013 |
| WO | 2013030937 | A1 | 3/2013 |
| WO | 2014006662 | A1 | 1/2014 |
| WO | 2014062967 | A1 | 4/2014 |
| WO | 2014096911 | A1 | 6/2014 |
| WO | 2014096911 | A2 | 6/2014 |

OTHER PUBLICATIONS

Notice of Acceptance for Australian Patent Application No. 2014277983, dated Jun. 25, 2018, 3 pages.
Notification of Reasons for Refusal for Japanese Patent Application No. 2016-519676, dated Jun. 12, 2018, 7 pages.
Final Office Action for U.S. Appl. No. 15/177,930, dated Jul. 26, 2018, 17 pages.
Corrected Notice of Allowability for U.S. Appl. No. 14/928,783, dated Jul. 30, 2018, 6 pages.
Final Office Action for U.S. Appl. No. 14/958,385, dated Jul. 26, 2018, 21 pages.
Corrected Notice of Allowability for U.S. Appl. No. 14/928,783, dated Aug. 10, 2018, 6 pages.
First Official Action for Mexican Patent Application No. MX/a/2017/005506, dated Jun. 8, 2018, 6 pages.
First Official Action for Mexican Patent Application No. MX/a/2017/005005, dated May 30, 2018, 4 pages.
First Official Action for Mexican Patent Application No. MX/a/2017/006836, dated Jun. 1, 2018, 6 pages.
Search Report for Japanese Patent Application No. 2011-512749, search date Aug. 14, 2013, 29 pages.
Office Action for Japanese Patent Application No. 2011-512749, drafting date Sep. 4, 2013, 7 pages.
International Preliminary Report on Patentability for PCT/US2014/041396, dated Dec. 17, 2015, 8 pages.
International Preliminary Report on Patentability for PCT/US2014/042300, dated Dec. 23, 2015, 9 pages.
International Preliminary Report on Patentability for PCT/US2014/042393, dated Dec. 23, 2015, 11 pages.
Office Action for Canadian Patent Application No. 2,727,034, dated Nov. 26, 2015, 4 pages.
Decision of Final Rejection for Japanese Patent Application No. 2014-119504, dated Nov. 10, 2015, 5 pages.
Translation of Decision to Grant for Japanese Patent Application No. 2014-119505, dated Dec. 15, 2015, 3 pages.
Office Action for Cuban Patent Application No. 2015-0088, dated Oct. 30, 2015, 3 pages.
Final Office Action for U.S. Appl. No. 13/888,102, dated Dec. 24, 2015, 18 pages.
Non-Final Office Action for U.S. Appl. No. 13/911,849, dated Nov. 24, 2015, 15 pages.
Sendin, Alberto, et al., "Enhanced Operation of Electricity Distribution Grids Through Smart Metering PLC Network Monitoring, Analysis and Grid Conditioning," Energies, vol. 6, Issue 1, Jan. 21, 2013, www.mdpi.com/journal/energies, pp. 539-556.
Colson, C.M., "Algorithms for Distributed Decision-Making for Multi-agent Microgrid Power Management," IEEE Power and Energy Society General Meeting, Jul. 24-29, 2011, San Diego, California, IEEE, pp. 1-8.
Wetula, Andrzej, "A Hilbert Transform Based Algorithm for Detection of a Complex Envelope of a Power Grid Signals—an Implementation," Journal of Electrical Power Quality and Utilisation, vol. 14, Issue 2, 2008, EPQU Journal, pp. 13-18.
Partial Supplementary European Search Report for European Patent Application No. 14754343.3, dated Feb. 8, 2016, 5 pages.
Extended European Search Report for European Patent Application No. 14754343.3, dated May 24, 2016, 12 pages.
Examination Report for European Patent Application No. 09759619.1, dated May 13, 2016, 7 pages.
Notice of Allowance and Examiner Initiated Interview Summary for U.S. Appl. No. 13/911,849, dated Apr. 5, 2016, 10 pages.
Corrected Notice of Allowance for U.S. Appl. No. 13/911,849, dated May 31, 2016, 4 pages.
Non-Final Office Action for U.S. Appl. No. 14/304,035, dated Feb. 25, 2016, 22 pages.
Final Office Action for U.S. Appl. No. 13/448,005, dated Jun. 6, 2016, 11 pages.
Non-Final Office Action for U.S. Appl. No. 14/720,780, dated Feb. 26, 2016, 7 pages.
Notice of Allowance for U.S. Appl. No. 13/566,481, dated Feb. 26, 2016, 7 pages.
International Search Report and Written Opinion for International Patent Application No. PCT/US2015/058423, dated Jan. 19, 2016, 12 pages.
International Search Report and Written Opinion for International Patent Application No. PCT/US2015/058492, dated Feb. 26, 2016, 18 pages.
International Search Report and Written Opinion for International Patent Application No. PCT/US2015/063752, dated Mar. 24, 2016, 16 pages.
International Preliminary Report on Patentability for International Patent Application No. PCT/US2012/33789, dated Oct. 24, 2013, 10 pages.
International Preliminary Report on Patentability for International Patent Application No. PCT/US2012/041971, dated Dec. 10, 2013, 6 pages.
International Preliminary Report on Patentability for International Patent Application No. PCT/US2012/049524, dated Feb. 4, 2014, 7 pages.
Final Office Action for U.S. Appl. No. 13/896,029, dated Jun. 22, 2016, 22 pages.
Final Office Action for U.S. Appl. No. 14/304,035, dated Aug. 26, 2016, 18 pages.
Final Office Action for U.S. Appl. No. 14/720,780, dated Sep. 1, 2016, 9 pages.
Partial Supplementary European Search Report for European Patent Application No. 14754339.1, dated Oct. 4, 2016, 6 pages.
European Search Report for European Patent Application No. 14754343.3, dated Jun. 10, 2016, 1 page.
Partial Supplementary European Search Report for European Patent Application No. 14754714.5, dated Oct. 6, 2016, 6 pages.
Non-Final Office Action for U.S. Appl. No. 13/896,029, dated Nov. 10, 2016, 18 pages.

(56) References Cited

OTHER PUBLICATIONS

Notice of Allowance for U.S. Appl. No. 13/871,944, dated Oct. 4, 2016, 9 pages.
Non-Final Office Action for U.S. Appl. No. 14/304,648, dated Sep. 7, 2016, 4 pages.
Notice of Allowance for U.S. Appl. No. 14/720,780, dated Nov. 4, 2016, 5 pages.
First Office Action for Chilean Patent Application No. 2325-2015, dated Jan. 26, 2017, 13 pages.
Extended European Search Report for European Patent Application No. 14754339.1, dated Jan. 16, 2017, 10 pages.
First Office Action for Chilean Patent Application No. 2323-2015, dated Jan. 26, 2017, 15 pages.
Office Action No. 13556 for Colombian Patent Application No. 15-222367, dated Nov. 28, 2016, 13 pages.
Examination Report No. 1 for Australian Patent Application No. 2014219244, dated Dec. 21, 2016, 4 pages.
First Office Action for Chilean Patent Application No. 2322-2015, dated Jan. 26, 2017, 15 pages.
Extended European Search Report for European Patent Application No. 14754714.5, dated Jan. 16, 2017, 10 pages.
Extended European Search Report for European Patent Application No. 14808081.5, dated Jan. 30, 2017, 7 pages.
Extended European Search Report for European Patent Application No. 14810273.4, dated Feb. 1, 2017, 12 pages.
Extended European Search Report for European Patent Application No. 14811042.2, dated Jan. 2, 2017, 7 pages.
Examination Report No. 1 for Australian Patent Application No. 2014219246, dated Dec. 22, 2016, 3 pages.
Advisory Action for U.S. Appl. No. 14/958,385, dated Sep. 26, 2018, 3 pages.
Non-Final Office Action for U.S. Appl. No. 13/896,029, dated Oct. 2, 2018, 19 pages.
First Substantive Report for Chilean Patent Application No. 201701036, dated Jul. 20, 2018, 17 pages.
Second Substantive Report for Chilean Patent Application No. 201701038, dated Sep. 3, 2018, 28 pages.
Second Substantive Report for Chilean Patent Application No. 201701394, dated Sep. 12, 2018, 10 pages.
Examination Report No. 1 for Australian Patent Application No. 2017279752, dated Sep. 18, 2018, 6 pages.
Advisory Action for U.S. Appl. No. 14/304,035, dated Nov. 30, 2016, 3 pages.
Final Office Action for U.S. Appl. No. 14/304,648, dated Mar. 9, 2017, 7 pages.
Non-Final Office Action for U.S. Appl. No. 15/184,642, dated Mar. 9, 2017, 5 pages.
Office Action No. 11851, Colombian Patent Application No. 15-222367, dated Mar. 17, 2017, 19 pages.
First Office Action for Chinese Patent Application No. 201480032631.X, dated Feb. 27, 2017, 5 pages.
First Office Action for Chinese Patent Application No. 201480034010.5, dated Feb. 17, 2017, 7 pages.
Yan, Ping et al., "Study of Linear Models in Steady State Load Flow Analysis of Power Systems," IEEE Power Engineering Society Winter Meeting, vol. 1, Jan. 27-31, 2002, New York, NY, IEEE, pp. 666-671.
Translated Summary of Office Action No. 4963 for Columbian Patent Application No. 15-222371, dated Apr. 5, 2017, 3 pages.
International Preliminary Report on Patentability for International Patent Application No. PCT/US2015/058423, dated May 11, 2017, 8 pages.
International Preliminary Report on Patentability for International Patent Application No. PCT/US2015/058492, dated May 11, 2017, 10 pages.
Non-Final Office Action for U.S. Appl. No. 14/304,035, dated May 17, 2017, 22 pages.
Final Office Action for U.S. Appl. No. 14/304,648, dated May 19, 2017, 7 pages.
Advisory Action for U.S. Appl. No. 14/304,648, dated May 24, 2017, 3 pages.
Non-Final Office Action for U.S. Appl. No. 14/928,783, dated May 8, 2017, 16 pages.
Examination Report No. 1 for Australian Patent Application No. 2014219247, dated Apr. 26, 2017, 4 pages.
Second Office Action for Chilean Patent Application No. 2323-2015, dated May 17, 2017, 14 pages.
Second Office Action for Chilean Patent Application No. 2322-2015, dated May 17, 2017, 13 pages.
First Office Action for Chinese Patent Application No. 201480009549.5, dated May 31, 2017, 9 pages.
Examination Report No. 1 for Australian Patent Application No. 2014277951, dated Jun. 8, 2017, 4 pages.
Office Action Summary for Columbian Patent Application No. 7058, dated Jun. 16, 2017, 2 pages.
International Preliminary Report on Patentability for International Patent Application No. PCT/US2015/063752, dated Jun. 15, 2017, 12 pages.
Non-Final Office Action for U.S. Appl. No. 13/871,944, dated Jun. 15, 2017, 14 pages.
First Office Action for Chinese Patent Application No. 201480009551.2, dated Jun. 19, 2017, 9 pages.
Extended European Search Report for European Patent Application No. 17173049.2, dated Aug. 11, 2017, 8 pages.
Examination report No. 1 for Australian Patent Application No. 2014277983, dated Jun. 16, 2017, 4 pages.
Non-Final Office Action for U.S. Appl. No. 13/896,029, dated Jul. 20, 2017, 17 pages.
Advisory Action for U.S. Appl. No. 14/304,648, dated Aug. 17, 2017, 3 pages.
Notice of Allowance for U.S. Appl. No. 15/184,642, dated Jul. 13, 2017, 8 pages.
Notice of Allowance for U.S. Appl. No. 15/184,642, dated Jul. 27, 2017, 4 pages.
Notice of Allowance for U.S. Appl. No. 14/929,087, dated Aug. 15, 2017, 9 pages.
Second Office Action for Chinese Patent Application No. 201480032631.X, dated Sep. 4, 2017, 5 pages.
Second Office Action for Chinese Patent Application No. 201480034010.5, dated Aug. 2, 2017, 5 pages
Final Office Action for U.S. Appl. No. 14/304,035, dated Oct. 5, 2017, 16 pages.
Notice of Allowance for U.S. Appl. No. 14/928,783, dated Nov. 6, 2017, 9 pages.
Advisory Action for U.S. Appl. No. 14/304,035, dated Dec. 29, 2017, 3 pages.
Office Action for Colombian Patent Application No. 15222371, dated Oct. 15, 2017, 9 pages.
First Office Action for Chinese Patent Application No. 201480034011.X, dated Oct. 30, 2017, 16 pages.
Notice of Acceptance for Australian Patent Application No. 2014219246, dated Dec. 5, 2017, 3 pages.
Office Action for Mexican Patent Application No. MX/a/2015/017231, dated Oct. 20, 2017, 13 pages.
Non-Final Office Action for U.S. Appl. No. 15/177,930, dated Mar. 3, 2017, 6 pages.
Non-Final Office Action for U.S. Appl. No. 15/177,930, dated Nov. 1, 2017, 14 pages.
International Telecommunications Union, "ITU-T G.9960, Series G: Transmission Systems and Media, Digital Systems and Networks," Dec. 1, 2011, 160 pages.
International Telecommunications Union, "Updated draft text for ITU-T G.9961, Series G: Transmission Systems and Media, Digital Systems and Networks—Amendment 1 Corrigendum 1," ITU-T: Telecommunication Standardization Sector, Study Group 15, Amendment approved Sep. 21, 2012, 82 pages.
International Telecommunications Union, "ITU-T G.9961, Series G: Transmission Systems and Media, Digital Systems and Networks," Apr. 1, 2014, 306 pages.
First Office Action for Chinese Patent Application No. 201480009550.8, dated Jan. 26, 2018, 4 pages.

(56) References Cited

OTHER PUBLICATIONS

Decision to Grant a Patent for Japanese Patent Application No. 2015-558888, dated Jan. 30, 2018, 4 pages.
Notice of Reasons for Rejection for Japanese Patent Application No. 2015-558889, dated Jan. 23, 2018, 7 pages.
Extended European Search Report for European Patent Application No. 17203296.3, dated Feb. 15, 2018, 8 pages.
Second Office Action for Chinese Patent Application No. 201480009549.5, dated Jan. 23, 2018, 4 pages.
Notice of Reasons for Rejection for Japanese Patent Application No. 2015-558887, dated Jan. 23, 2018, 7 pages.
Author Unknown, "MicroPianet® Voltage Regulators," EnergyIdeas Clearinghouse PTR #6.4, Product and Technology Review, Jun. 2008, 6 pages, http://www.energyideas.org/documents/factsheets/PTR/Microplanet.pdf.
Author Unknown, "Prime Alliance Official Website," Web, Date Accessed: Nov. 4, 2015, 3 pages, http://www.prime-alliance.org/.
Author Unknown, "The G3 PLC Alliance Unveils its Interoperability process," The G3-PLC Alliance, Oct. 8, 2012, Paris, France, http://www.g3-plc.com/content/press-releases, p. 1.
Author Unknown, "TWACS Low Frequency Power Line Communication Signals Problematic to Public Health," dated May 3, 2013, 20 pages, http://www.eiwellspring.org/smartmeter/TWACS.pdf.
Author Unknown, "Universal Powerline Bus Communication Technology Overview," Powerline Control Services, Jan. 8, 2002, 13 pages, http://pulseworx.com/downloads/upb/UpbOverview.pdf.
Baggini, Angelo "Handbook of Power Quality" John Wiley & Sons, Ltd., 2008, 65 pages.
Bates, Michael, "CVR has Potential Beyond Pushing Efficiencies on Feeders." renewGRID, Mar. 26, 2012, 2 pages, http://www.renew-grid.com/e107plugins/contenl/contenl.php?contenl.8215.
Bresesti, Paola et al., "SDNO: Smart Distribution Network Operation Project", Power Engineering Society General Meeting, IEEE, 2007, 4 pages.
Choi, Moonsuk et al., "Design of Integrated Meter Reading System based on Power-Line Communication", Power Line Communications and Its Applications, IEEE, International Symposium, 2008, pp. 280-284.
Collins, Dermot et al., "Transmission on Power Line Cables," Telektronikk, vol. 95, No. 2/3, 1999, pp. 134-137.
Dilek, M., "Integrated Design of Electrical Distribution Systems: Phase Balancing and Phase Prediction Case Studies," Dissertation, 2001, 150 pages, http://scholar.lib.vt.edu/theses/available/etd-11132001-222401/.
Goh, Chong Hock K., "A Current Study of Automatic Meter Reading Solutions via Power Line Communications," 19 pages, http://wpweb2k.gsia.cmu.edu/ceic/publicatons.htm. (Published 2003 or later as evidenced by the bibliography).
Ha, K. A., "Power Line Communication Technology," Presentation at Hong Kong Institute of Engineers Seminar on Last Mile Technology, Jun. 20, 2003, 24 pages.
Hooijen, Olaf G. "A Channel Model for the Residential Power Circuit Used as a Digital Communications Medium," IEEE Transactions on Electromagnetic Compatibility, vol. 40, No. 4, Nov. 1998, pp. 331-336.
McGhee, Jim et al., "Smart High Voltage Substation based on IEC 61850 Process Bus and IEEE 1588 Time Synchronization" 2010 First IEEE International Conference on Smart Grid Communications, IEEE, Oct. 4-6, 2010, pp. 489-494.
Mitchell, Travis, "Dominion Conservation Voltage Reduction software reduces energy use by 2.8%," Fierce Energy Daily, Sep. 27, 2011, 3 pages, http://www.fierceenergy.com/story/dominion-conservation-voltage-reduction-software-reduces-energy-use-28/2011-09-27.
Montoya, Luis F.,"Power Line Communications Performance Overview of the Physical Layer of Available Protocols," Thesis of Research, University of Florida, Gainesville, Florida, Date Unknown, pp. 1-15.
Moreno-Munoz A., et al., "Integrating Power Quality to Automated Meter Reading", IEEE Industrial Electronics Magazine, IEEE, US, vol. 2, No. 2, Jun. 17, 2008, pp. 10-18.
Newbury, John, "Efficient Communication Services Using the Low Voltage Distribution Line," Proceedings of 2002 PES Winter Meeting, IEEE, 2002, pp. 579-591.
Nyack, Cuthbert A., "Convolution and Autocorrelation," Web, Date Accessed: Nov. 4, 2015, 3 pages, http://cnyack.homestead.com/files/aconv/convau1.htm.
Pallares-Lopez et al., "Embedding synchronism in SmartGrid with IEEE1588-based for Intelligent Electronics," 2010 First IEEE International Conference on Smart Grid Communications, published/presented Oct. 4-6, 2010, Gaithersburg, Maryland, 7 pages.
Pavlidou, Niovi et al., "Power Line Communications: State of the Art and Future Trends," IEEE Communications Magazine, IEEE, vol. 41, No. 4, Apr. 2003, pp. 34-40.
Rye, Dave, "The X-10 Powerhouse Power Line Interface Model #PL513 and Two-Way Power Line Interface Model #TW523," X-10 Inc., X-10.RTM. Powerhouse (TM) Technical Note, Revision 2.4, 1991, 12 pages.
Schickhuber, Gerald et al., "Control Using Power Lines—A European View," Computing & Control Engineering Journal, vol. 8, No. 4, Aug. 1997, pp. 180-184.
Sherman et al, "Location Authentication through Power Line Communication: Design, Protocol, and Analysis of a New Out of Band Strategy," Cyber Defense Lab, Department of CSEE, University of Maryland, Baltimore County, pp. 279-284.
Van Rensburg, Petrus A. Hanse et al., "Design of a Bidirectional Impedance-Adapting Transformer Coupling Circuit for Low-Voltage Power-Line Communications," IEEE Transactions on Power Delivery, IEEE, vol. 20, No. 1, Jan. 2005, pp. 64-70.
International Search Report for International Patent Application No. PCT/US2014/016538, dated Jun. 16, 2014, 3 pages.
International Preliminary Report on Patentability for PCT/US2014/016538, dated Sep. 3, 2015, 10 pages.
International Search Report for PCT/US2014/016540, dated Jun. 17, 2014, 3 pages.
International Preliminary Report on Patentability for PCT/US2014/016540, dated Sep. 3, 2015, 9 pages.
International Search Report for PCT/US2014/016535, dated Jun. 3, 2014, 2 pages.
International Preliminary Report on Patentability for PCT/US2014/016535, dated Sep. 3, 2015, 8 pages.
International Search Report and Written Opinion for PCT/US2014/041396, dated Oct. 29, 2014, 12 pages.
International Search Report and Written Opinion for PCT/US2014/042300, dated Oct. 20, 2014, 16 pages.
International Search Report and Written Opinion for PCT/US2014/042393, dated Oct. 20, 2014, 15 pages.
International Search Report for PCT/US2009/046644, dated Mar. 2, 2010, 7 pages.
International Preliminary Report on Patentability for PCT/US2009/046644, dated Dec. 6, 2010, 10 pages.
International Search Report for PCT/US2012/033789, dated Sep. 6, 2012, 4 pages.
International Search Report for PCT/US2012/041971, dated Dec. 7, 2012, 5 pages.
International Search Report for PCT/US2012/049524, dated Jan. 3, 2013, 3 pages.
Non-Final Office Action for U.S. Appl. No. 13/566,481, dated Aug. 7, 2015, 27 pages.
Non-Final Office Action for U.S. Appl. No. 13/493,983, dated Feb. 5, 2014, 11 pages.
Final Office Action for U.S. Appl. No. 13/493,983, dated Oct. 31, 2014, 12 pages.
Non-Final Office Action for U.S. Appl. No. 13/448,005, dated Sep. 11, 2014, 20 pages.
Non-Final Office Action for U.S. Appl. No. 13/448,005, dated Apr. 15, 2015, 22 pages.
Non-Final Office Action for U.S. Appl. No. 12/480,493, dated Jul. 16, 2012, 24 pages.
Notice of Allowance and Examiner-Initiated Interview Summary for U.S. Appl. No. 12/480,493, dated Jun. 20, 2013, 13 pages.

(56) References Cited

OTHER PUBLICATIONS

Non-Final Office Action for U.S. Appl. No. 13/896,029, dated Sep. 18, 2015, 16 pages.
Non-Final Office Action for U.S. Appl. No. 13/871,944, dated Oct. 16, 2015, 13 pages.
Non-Final Office Action for U.S. Appl. No. 13/888,102, dated Jul. 9, 2015, 18 pages.
Berger, L. T., et al., "Power Line Communications for Smart Grid Applications," Journal of Electrical and Computer Engineering, vol. 2013, Article ID 712376, Accepted Dec. 29, 2012, 16 pages.
Hauser, C. H., et al., "A Failure to Communicate: Next Generation Communication Requirements, Technologies, and Architecture for the Electric Power Grid," IEEE Power and Energy Magazine, vol. 3, Issue 2, Mar.-Apr. 2005, pp. 47-55.
Kang, J.-M., et al., "Design and Implementation of Network Management System for Power Line Communication Network," 2007 IEEE International Symposium on Power Line Communications and Its Adaptations, Mar. 26-28, 2007, Pisa, Italy, pp. 23-28.
Kim, Y., et al., "PLC technology of KEPCO," 2005 International Symposium on Power Line Communications and Its Applications, Apr. 6-8, 2005, Vancouver, British Columbia, Canada, pp. 390-393.
Papadopoulos, T. A., et al., Low-Voltage Distribution Line Performance Evaluation for PLC Signal Transmission, IEEE Transactions on Power Delivery, vol. 23, Issue 4, Oct. 2008, pp. 1903-1910.
Non-Final Office Action for U.S. Appl. No. 15/078,646, dated Jun. 15, 2018, 33 pages.
Supplemental Notice of Allowability for U.S. Appl. No. 14/304,035, dated May 24, 2018, 6 pages.
Non-Final Office Action for U.S. Appl. No. 14/304,648, dated Jun. 13, 2018, 13 pages.
Corrected Notice of Allowance for U.S. Appl. No. 14/928,783, dated Jun. 8, 2018, 6 pages.
Official Action No. 5493 for Colombian Patent Application No. NC2017/0010584, dated May 4, 2018, 35 pages.
First Official Action for Mexican Patent Application No. MX/a/2015/017227, dated Apr. 11, 2018, 6 pages.
Notice of Reasons for Rejection for Japanese Patent Application No. 2016-518052, dated Feb. 20, 2018, 8 pages.
Third Office Action for Chinese Patent Application No. 201480034010.5, dated Jan. 17, 2018, 4 pages.
Notice of Reasons for Rejection for Japanese Patent Application No. 2016-519694, dated Feb. 27, 2018, 11 pages.
First Examination Report for Indian Patent Application No. 13/CHENP/2011, dated Jan. 11, 2018, 6 pages.
Office Action for Canadian Patent Application No. 2,870,452, dated Dec. 28, 2017, 4 pages.
Office Action for Canadian Patent Application No. 2,874,132, dated Jan. 25, 2018, 3 pages.
Extended European Search Report for European Patent Application No. 15853935.3, dated Feb. 15, 2018, 10 pages.
Extended European Search Report for European Patent Application No. 15855864.3, dated Feb. 21, 2018, 9 pages.
Final Office Action for U.S. Appl. No. 13/896,029, dated Jan. 24, 2018, 22 pages.
Notice of Allowance for U.S. Appl. No. 13/871,944, dated Feb. 23, 2018, 18 pages.
Notice of Allowance for U.S. Appl. No. 14/304,035, dated Feb. 7, 2018, 9 pages.
Corrected Notice of Allowance for U.S. Appl. No. 14/928,783, dated Jan. 23, 2018, 6 pages.
Corrected Notice of Allowance for U.S. Appl. No. 14/928,783, dated Feb. 15, 2018, 6 pages.
Non-Final Office Action for U.S. Appl. No. 14/958,385, dated Jan. 12, 2018, 33 pages.
Supplemental Notice of Allowability for U.S. Appl. No. 14/304,035, dated Apr. 18, 2018, 6 pages.
Non-Final Office Action for U.S. Appl. No. 15/934,499, dated May 7, 2018, 30 pages.
Non-Final Office Action for U.S. Appl. No. 15/257,191, dated Apr. 4, 2018, 10 pages.
Non-Final Office Action for U.S. Appl. No. 15/450,153, dated Apr. 19, 2018, 10 pages.
Interview Summary for U.S. Appl. No. 14/958,385, dated Apr. 6, 2018, 3 pages.
Extended European Search Report for European Patent Application No. 18152637.7, dated Apr. 26, 2018, 8 pages.
Notice of Acceptance for Australian Patent Application No. 2014219247, dated Apr. 11, 2018, 3 pages.
Second Examination Report for Australian Patent Application No. 2014277983, dated Mar. 15, 2018, 4 pages.
Second Official Action for Mexican Patent Application No. MX/a/2015/017231, dated Feb. 28, 2018, 5 pages.
Notice of Acceptance for Australian Patent Application No. 2014277951, dated Mar. 28, 2018, 3 pages.
Extended European Search Report for European Patent Application No. 15865305.5, dated May 3, 2018, 8 pages.
Notice of Allowance for U.S. Appl. No. 14/928,783, dated May 9, 2018, 9 pages.
Notice of Allowance for U.S. Appl. No. 15/852,496, dated Mar. 8, 2018, 9 pages.
Official Action for Mexican Patent Application No. MX/a/2015/010689, dated Jan. 25, 2019, 6 pages.
Official Action for Mexican Patent Application No. MX/a/2015/010688, dated Jan. 25, 2019, 8 pages.
Examination Report for Australian Patent Application No. 2014274664, dated Feb. 15, 2019, 2 pages.
Examination Report for European Patent Application No. 14810273.4, dated Mar. 21, 2019, 11 pages.
First Office Action for Chinese Patent Application No. 201580059331.5, dated Mar. 5, 2019, 11 pages.
Non-Final Office Action for U.S. Appl. No. 14/958,385, dated Mar. 18, 2019, 24 pages.
Notice of Acceptance for Australian Patent Application No. 2017279752, dated Apr. 12, 2019, 3 pages.
Examination Report for Australian Patent Application No. 2015338943, dated Apr. 5, 2019, 3 pages.
Examiner's Report for Canadian Patent Application No. 2,870,452, dated Oct. 2, 2018, 4 pages.
Examination Report for European Patent Application No. 15853935.3, dated Oct. 22, 2018, 5 pages.
Final Office Action for U.S. Appl. No. 13/896,029, dated Jun. 14, 2019, 21 pages.
Final Office Action for U.S. Appl. No. 15/177,930, dated Jun. 27, 2019, 16 pages.
Non-Final Office Action for U.S. Appl. No. 14/304,648, dated Apr. 29, 2019, 14 pages.
Applicant-Initiated Interview Summary for U.S. Appl. No. 14/958,385, dated Jun. 11, 2019, 6 pages.
Applicant-Initiated Interview Summary for U.S. Appl. No. 14/958,385, dated Jun. 12, 2019, 5 pages.
Decision to Grant for Japanese Patent Application No. 2016-519676, dated Apr. 16, 2019, 4 pages.
Examination Report No. 1 for Australian Patent Application No. 2015358448, dated May 6, 2019, 3 pages.
Third Official Action for Mexican Patent Application No. MX/a/2017/006836, dated Jun. 4, 2019, 7 pages.
Non-Final Office Action for U.S. Appl. No. 15/177,930, dated Nov. 29, 2018, 15 pages.
Final Office Action for U.S. Appl. No. 15/450,153, dated Nov. 28, 2018, 7 pages.
Final Office Action for U.S. Appl. No. 14/304,648, dated Nov. 29, 2018, 12 pages.
Final Office Action for U.S. Appl. No. 15/257,191, dated Nov. 2, 2018, 10 pages.
Office Action for Canadian Patent Application No. 2,874,132, dated Jan. 3, 2019, 3 pages.
Second Official Action for Mexican Patent Application No. MX/a/2017/006836, dated Dec. 6, 2018, 8 pages.
Notice of Not Fully Responsive Reply for Applications Under Accelerated Examination for U.S. Appl. No. 15/078,646, dated Jan. 24, 2019, 8 pages.
Official Action for Mexican Patent Application No. MX/a/2015/016809, dated Jan. 14, 2019, 4 pages.

(56) References Cited

OTHER PUBLICATIONS

Feng, Yang, "Solving for the Low-Voltage/Large-Angle Power-Flow Solutions by Using the Holomorphic Embedding Method," Doctoral Dissertation, Arizona State University, Aug. 2015, 220 pages.

Xu, Dan, et al., "Project 32: Optimal Topology Discovery for Automatic Meter Reading Using Powerline Carrier," Part 4 Project Final Report, Department of Electrical and Electronic Engineering, University of Auckland, New Zealand, 2003, 53 pages.

Notice of Allowance for U.S. Appl. No. 15/177,930, dated Sep. 13, 2019, 10 pages.

Notice of Allowance for U.S. Appl. No. 15/078,646, dated Jul. 17, 2019, 11 pages.

Final Office Action for U.S. Appl. No. 14/958,385, dated Aug. 23, 2019, 30 pages.

Non-Final Office Action for U.S. Appl. No. 15/395,656, dated Sep. 16, 2019, 14 pages.

Karl, M. et al., "Selection of an Optimal Modulation Scheme for Digital Communications over Low Voltage Power Lines," Proceedings of ISSSTA'95, International Symposium on Spread Spectrum Techniques and Applications, Sep. 1996, Mainz, Germany, IEEE, pp. 1087-1091.

Pimentel, P.R.S. et al., "Revolution in the Distribution (Use of the technology Power Line Communication in the transmission of Data, Voice, and Images," 2004 IEEE/PES Transmission & Distribution Conference & Exposition: Latin America, Nov. 8-11, 2004, Sao Paulo, Brazil, IEEE, pp. 314-320.

Notice of Acceptance for Australian Patent Application No. 2014274664, dated Sep. 2, 2019, 8 pages.

Examination Report No. 1 for Australian Patent Application No. 2018203997, dated Aug. 2, 2019, 4 pages.

Summons to Attend Oral Proceedings for European Patent Application No. 09759619.1, dated Jun. 26, 2019, 8 pages.

Notice of Acceptance for Australian Patent Application No. 2015338943, dated Aug. 29, 2019, 9 pages.

Notice of Acceptance for Australian Patent Application No. 2015358448, dated Sep. 19, 2019, 10 pages.

Final Office Action for U.S. Appl. No. 14/304,648, dated Oct. 2, 2019, 15 pages.

Office Action for Canadian Patent Application No. 2,909,483, dated Nov. 22, 2019, 6 pages.

Office Action for Canadian Patent Application No. 2,901,607, dated Nov. 19, 2019, 4 pages.

First Office Action for Chinese Patent Application No. 201580064834.1, dated Nov. 4, 2019, 11 pages.

Fourth Official Action for Mexican Patent Application No. MX/a/2017/006836, dated Nov. 8, 2019, 9 pages.

* cited by examiner

SYSTEM AND METHOD FOR DETECTING AND LOCALIZING NON-TECHNICAL LOSSES IN AN ELECTRICAL POWER DISTRIBUTION GRID

CROSS REFERENCE TO RELATED APPLICATIONS

This application is a continuation of co-pending U.S. patent application Ser. No. 14/304,035, filed Jun. 13, 2014, entitled "SYSTEM AND METHOD FOR DETECTING AND LOCALIZING NON-TECHNICAL LOSSES IN AN ELECTRICAL POWER DISTRIBUTION GRID," which claims the benefit of U.S. Provisional Patent Application No. 61/834,567, filed Jun. 13, 2013, entitled "SYSTEM AND METHOD FOR DETECTING AND LOCALIZING NON-TECHNICAL LOSSES IN AN ELECTRICAL POWER DISTRIBUTION GRID," the disclosures of each of which are incorporated herein by reference in their entireties.

FIELD OF THE INVENTION

The present invention is directed toward applications of on-grid communications for optimizing electrical distribution, and specifically for real-time identification and location of non-technical losses occurring in a service transformer area network.

BACKGROUND OF THE INVENTION

Electrical Distribution Substations contain one or more Substation Transformers, which step down the voltage from high transmission line levels (typically 130 kV to 700 kV) to the medium voltage levels (typically from 4 kV to about 35 kV) at which power is distributed to consumers within a distribution service area. At the edge of the Distribution Grid are a number of Service Transformers, which transform the medium voltage of the distribution grid to the low voltages (in the US, typically 120, 208, 240, 277, or 480) required for commercial, industrial, and residential consumers. Other voltages in addition to some of these can be used elsewhere in the world. Each Service Transformer powers one or more metered loads. A load can be a dwelling, a commercial or industrial building, an element of municipal infrastructure such as a series of street lamps, or agricultural apparatus such as irrigation systems.

Other than the wires connecting a consumer load and the associated meter to a service transformer, the service transformer is the outermost element of the distribution grid before the power is actually delivered to a consumer. A meter is typically attached at the point where the power from the service transformer is delivered to a consumer. Service transformers can be three-phase, dual-phase, or single phase, as can meters. Herein the collection of electrical apparatus inclusive from a service transformer to the collection of at least two communicating electrical meters is referred to as a Transformer Area Network (TAN). A TAN can have a radial topology, such as is common in the US, or it can have a linear or "bus" topology, as is more common in Europe and elsewhere in the world.

Traditionally, reading meters was one of the largest operational costs incurred by electrical utilities. Original electric meters were analog devices with an optical read-out that had to be manually examined monthly to drive the utility billing process. Beginning in the 1970s, mechanisms for digitizing meter data and automating its collection began to be deployed. These mechanisms evolved from walk-by or drive-by systems where the meter would broadcast its current reading using a short-range radio signal, which was received by a device carried by the meter reader. These early systems were known as Automated Meter Reading systems or AMRs. Later, a variety of purpose-built data collection networks, commonly employing a combination of short-range RF repeaters in a mesh configuration with collection points equipped with broadband backhaul means for transporting aggregated readings began to be deployed.

These networks were capable of two-way communication between the "metering head-end" at a utility service center and the meters at the edge of this data collection network, which is generally called an Advanced Metering Infrastructure or AMI. AMIs can collect and store readings frequently, typically as often as every 15 minutes, and can report them nearly that often. They can read any meter on demand provided that this feature is used sparingly, and can connect or disconnect any meter on demand as well. AMI meters can pass signals to consumer devices for the purpose of energy conservation, demand management, and variable-rate billing. Because the AMI network is separate from the power distribution grid except for the intersection at the meters, AMI meters are neither aware of nor sensitive to changes in the grid topology or certain conditions on the grid. Nonetheless, the introduction of AMI is generally considered to be the beginning of the distribution Smart Grid. Additionally, because of the mesh architecture typically used in the AMIs in the United States, the available bandwidth for an individual electrical meter to send its own data is quite limited.

The total billable kilowatt-hours produced by a typical electrical distribution grid anywhere in the world is substantially less than the actual power distributed, as measured at a distribution substation, over the billing period. The loss of power can be classified into two groups. Technical losses result from the overall impedance of the distribution infrastructure, from power-factor mismatch between what the population of loads requires and what the grid produces at each load point, and the fact that utilities oversupply voltage to ensure that power sags will not occur during unpredictable peak loads. Utilities can work to minimize these technical losses, but some technical losses are unavoidable.

Non-technical losses of actual power-hours (as opposed to revenue) result from power theft by consumers who avoid or subvert the metering process by tampering with meters or by tapping power lines above the metered load points. Non-technical revenue losses also include non-payment of bills by customers, and accounting errors by utilities. However, these types of revenue losses are addressed by Meter Data Management systems integrated with the Advanced Metering Infrastructure. These automated systems have the capability to prevent clerical errors, to immediately cut off service to non-paying customers, and to require customers with poor payment histories to be on a pay-in-advance billing plan. Because AMIs provide little or no information about the grid-schematic relationship of one electrical meter to another and the relationship between the electrical meter and the service transformer supplying it with power, AMIs are of little value in pinpointing the source of power theft. Some Smart Meters can detect and report tampering. On the other hand, the absence of meter readers from neighborhoods reduces the chance that illegal taps will be seen and reported.

The social and financial costs of power theft are highly variable, in the developing world, these costs are quite high: sometimes exceeding 50% of power delivered from substations. In India, for example, the major private utilities (Reliance and Tata) report non-technical losses around 10%, but the state-owned utilities have losses exceeding 30% in most cases, according to the India's Maharashtra Electricity Regulation Commission (MERC).

In the developed world, losses from theft represent a relatively small percentage of the total generation cost. In the United States, losses from theft have traditionally been estimated at one to three percent of revenue, though this figure increases during difficult economic times.

Power theft represents a safety and quality service issue as well as an economic issue. Jury-rigging power taps is dangerous and often results in injury and even death. Additionally, the jury-rigged taps represent a fire hazard. Most significantly the resultant unpredictable loading of the distribution grid can cause transformer fires and explosions that can result not only in dangerous situations but in major power outages.

Prior art methods for detecting power theft can be divided into three categories. One category involves comparing voltage and current at a meter with voltage and current at a point of origin for delivery, such as the service distribution transformer for a neighborhood. The technical losses due to the resistance of the low voltage line between the point of origin and each meter are presumed to be less than a predetermined amount, so that any difference in power loss above the predetermined amount can be presumed to be due either to theft or to line defects. United States Patent Application Publication No. 2012/0265355, titled System and Method for Single and and Multizonal Optimization of Utility Services Delivery and Utilization (incorporated herein by reference) describes a system of this sort, wherein intelligent software agents at the service transformer collect measurements both at the transformer and from other instruments located at or incorporated in the electric meters. Theft detection is cited as one of the applications of this system. However, systems involving placing agents and instruments at the transformer are less desirable than would be a system that did not require any devices at the transformer, because transformers are far less physically accessible than meter sockets, and modifying them by adding instrumentation inside the transformer housing or on the high-voltage side of the transformer can be costly and even dangerous.

A second category involves measuring current and voltage outside the meter of a metered load, and inside the premises of the metered load. If more power is being used on the premises than is being delivered via the meter, then either power is being locally generated on the premises, or the meter is being bypassed. Methods of this sort are problematic for utilities because a service utility typically does not have access to data from inside the metered load. The consumer would have to agree to the placement of devices inside the premises.

A third category involves detecting the instantaneous changes in power usage or minor outages caused by tampering with the distribution lines in order to install an unmetered tap. This category of mechanism fails short because tampering can be masked by larger events such as a legitimate outage or interruption in service, and because it would create many false positives.

SUMMARY OF THE INVENTION

The present invention is an apparatus and methods for real-time or near-real-time detecting and reporting of power theft in such a way that the tamper point may be determined to have occurred on the low voltage side of a specific service transformer. In cases of meter tampering the specific meter or meters involved may be identified. The present invention does not require instrumentation of the transformer at the service delivery point (service transformer). All instruments and the intelligent agents which perform and collect the measurements and process the collected data to find evidence of power theft are located where instruments and intelligence would reside anyway: at the electrical meter. This is beneficial in that the meter socket is typically easily accessible, and because a smart meter already contains memory and processors for hosting software agents, already has the capability of making many of the measurements used by the methods of the present invention, and because most smart meters are designed to accommodate an additional circuit board where the native instruments, communication capabilities, and/or memory and processing capabilities are insufficient to support the methods described herein.

U.S. patent application Ser. No. 13/871,944, titled A System and Method for inferring Schematic and Topological Properties of an Electrical Distribution Grid, incorporated herein by reference, describes augmenting Smart Meters with long-range (Edge-to-Substation) on-grid transmitters, and also short-range (low voltage, local to the service transformer) on grid transceivers. A Smart Meter having both short-range and long-range on-grid transmission capability is called a Remote Hub. A Smart Meter having only short-range on-grid capability is called a Subordinate Remote. The term Remotes is used to refer collectively to both Subordinate Remotes and Remote Hubs. A service transformer having a Remote Hub and zero or more Subordinate Remotes is defined as a Transformer Area Network, or TAN. Further, that application discloses a method for determining the feeder and phase supplying a Remote Hub with power based on characteristics of a long-range message transmitted from the Remote Hub.

U.S. patent application Ser. No. 13/888,102, titled Methods for Discovering, Partitioning, Organizing, and Administering Communication Devices in a Transformer. Area Network, also incorporated herein by reference, teaches a method of ensuring that all Remote Hubs and Subordinate Remotes in a TAN are, in fact, supplied with power by the same service transformer, and, in the case of a multi-phase transformer, determining which Remotes are on the same phase as a Remote Hub and which Remotes are on a different phase. Additionally, U.S. patent application Ser. No. 13/911,849, titled A System and Method for Inferring Schematic Relationships between Load Points and Service Transformers and incorporated herein by reference, describes a method for identifying the specific service transformer and its geospatial coordinates which supply a given meter socket, and incorporating the association and coordinates into a map of the distribution grid. The utility already knows at least the street address, if not the precise geospatial coordinates, of every meter. Using the information obtained from the systems and methods in the above-referenced applications, the physical and schematic origin of a report from a Remote Hub, and the physical and schematic extent of the Transformer Area Network the Remote Huh represents, may be very precisely defined. These inventions teach a Transformer Area Network Architecture which is master-slave in nature, wherein one Remote, typically the Remote Hub, contains most of the intelligence, and polls simpler agents on the Subordinate Remotes both to organize the TAN, and to implement applications on the TAN. The system and methods of the present invention are primarily described in terms of such a TAN organization. However, a master-slave network organization is only one of the possible network organizations suitable for hosting the present invention. For example, a peer-to-peer transformer area network is also suitable. A wider peer-to-peer network, such as an AMI mesh network, might also be suitable given that a) the nodes in the network have sufficient information to partition themselves logically by transformer area, and b) that there is sufficient bandwidth for sharing the measurements taken by the measurement agents of the present invention, as described herein below.

The present invention provides a method for a Remote Hub in communication with at least one Subordinate Remote, each Remote operable to measure and store voltage at the meter and current passing from the meter to the metered load, to identify indications that power theft is occurring in the TAN, without placing apparatus either at the service transformer of the TAN or inside the premises of the loads powered by the TAN. For this purpose, the TAN comprises at least two nodes, such as one Remote Hub and one or more Subordinate Remotes, on each phase of the TAN. Further, every load (metered service point) on the TAN has a Remote (or another type of communicating meter) if complete theft protection is to be achieved. The method can be employed with some meters not having a Remote, but some thefts may go undetected in that case, depending on the topology of the TAN and the location of the unauthorized tap with respect to the communicating meters. Methods for inferring the existence and location of illegal taps that do not require taking measurements at the service transformer of the TAN are taught. Avoiding the need to take measurements at the service transformer is desirable because the cost of only adding instrumentation at the meters is significantly lower than the cost of adding instrumentation at both the meter and the transformer, as is the cost of maintaining the network when all instruments and intelligence reside at the meter only. Avoiding the need to place apparatus inside the premises of the metered service point is desirable because the consent of the consumer is required to place apparatus inside the premises, and because maintenance of equipment inside the premises is typically outside the charter of the utility.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Figure 1:
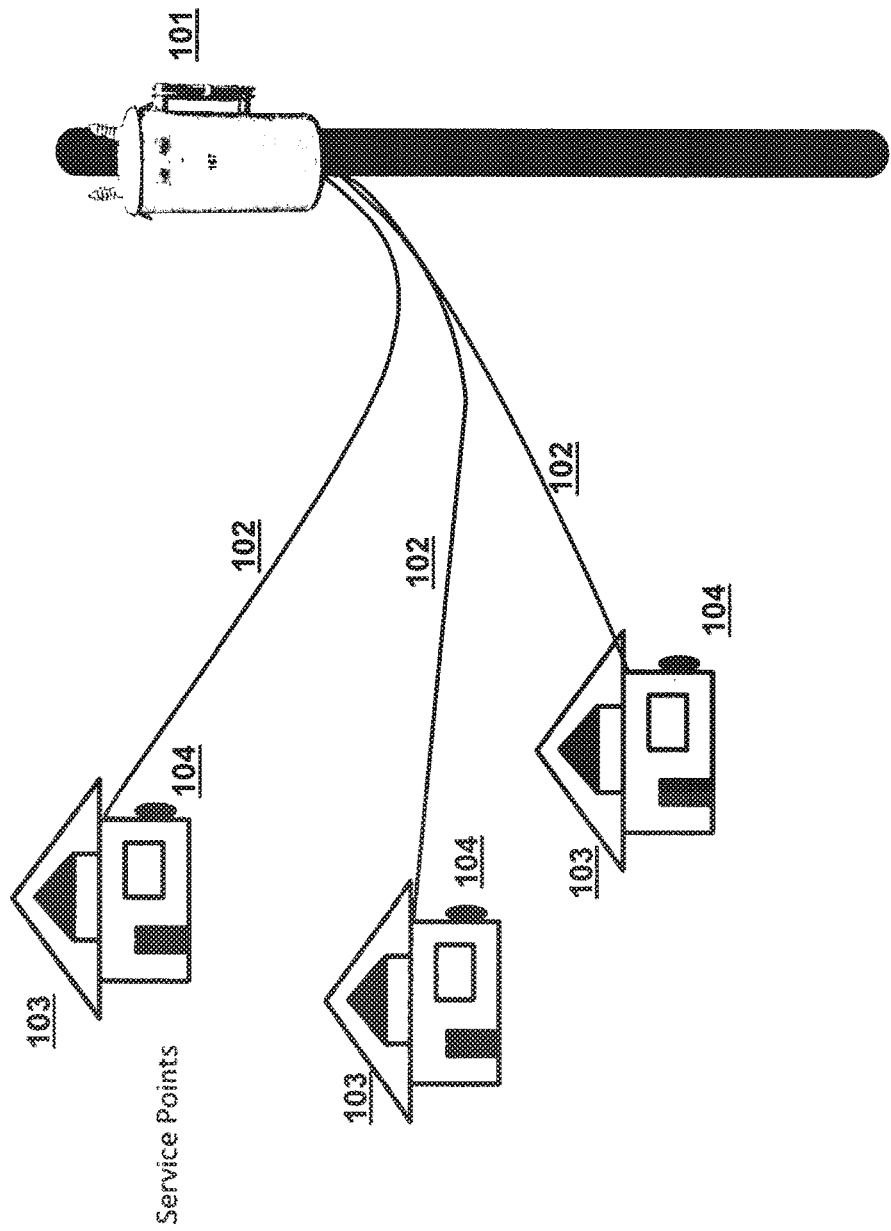
FIG. 1 illustrates a radial-topology transformer area, with an above-ground transformer and power lines and three metered premises.
Figure 2:
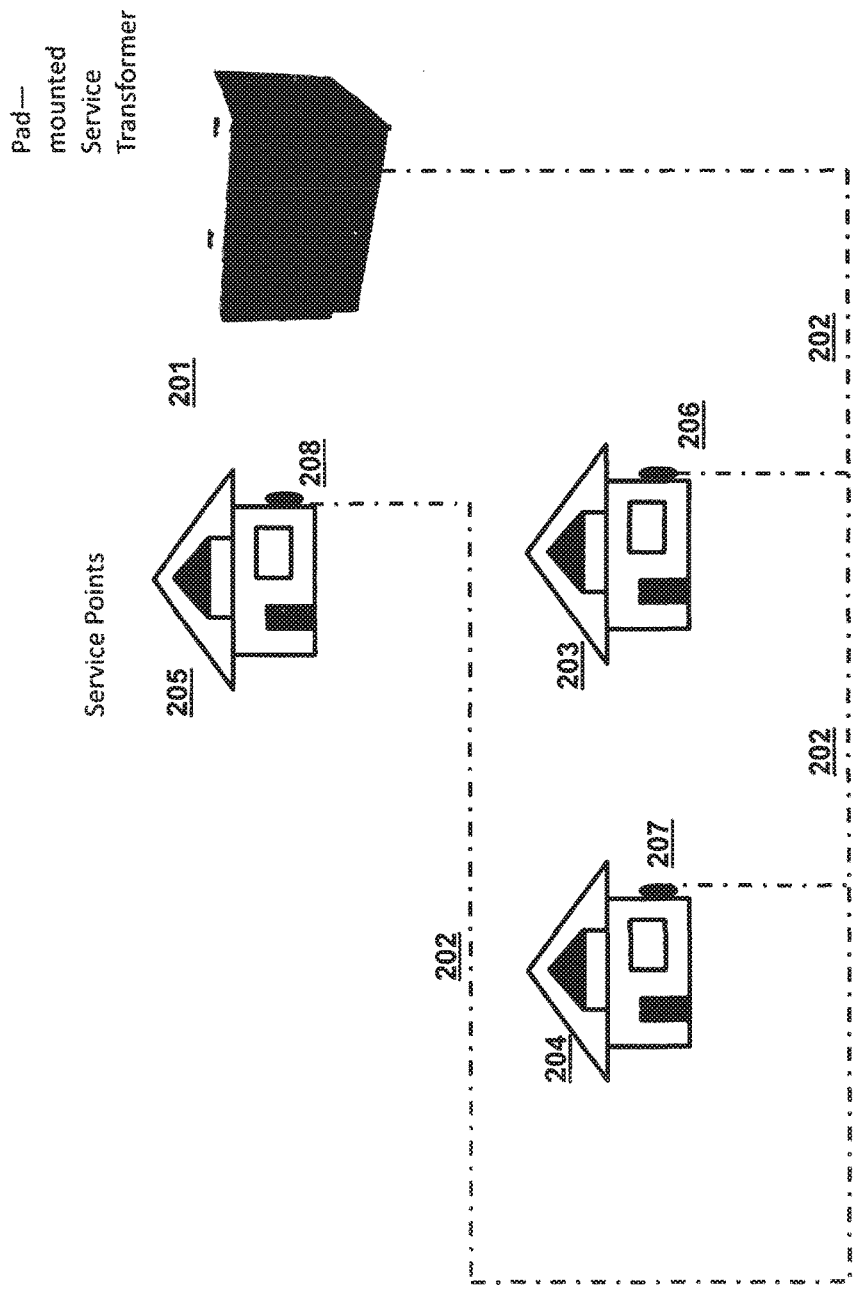
FIG. 2 illustrates a bus-topology transformer area with a pad-mounted transformer, underground power lines, and three metered premises along a single tap.
Figure 3:
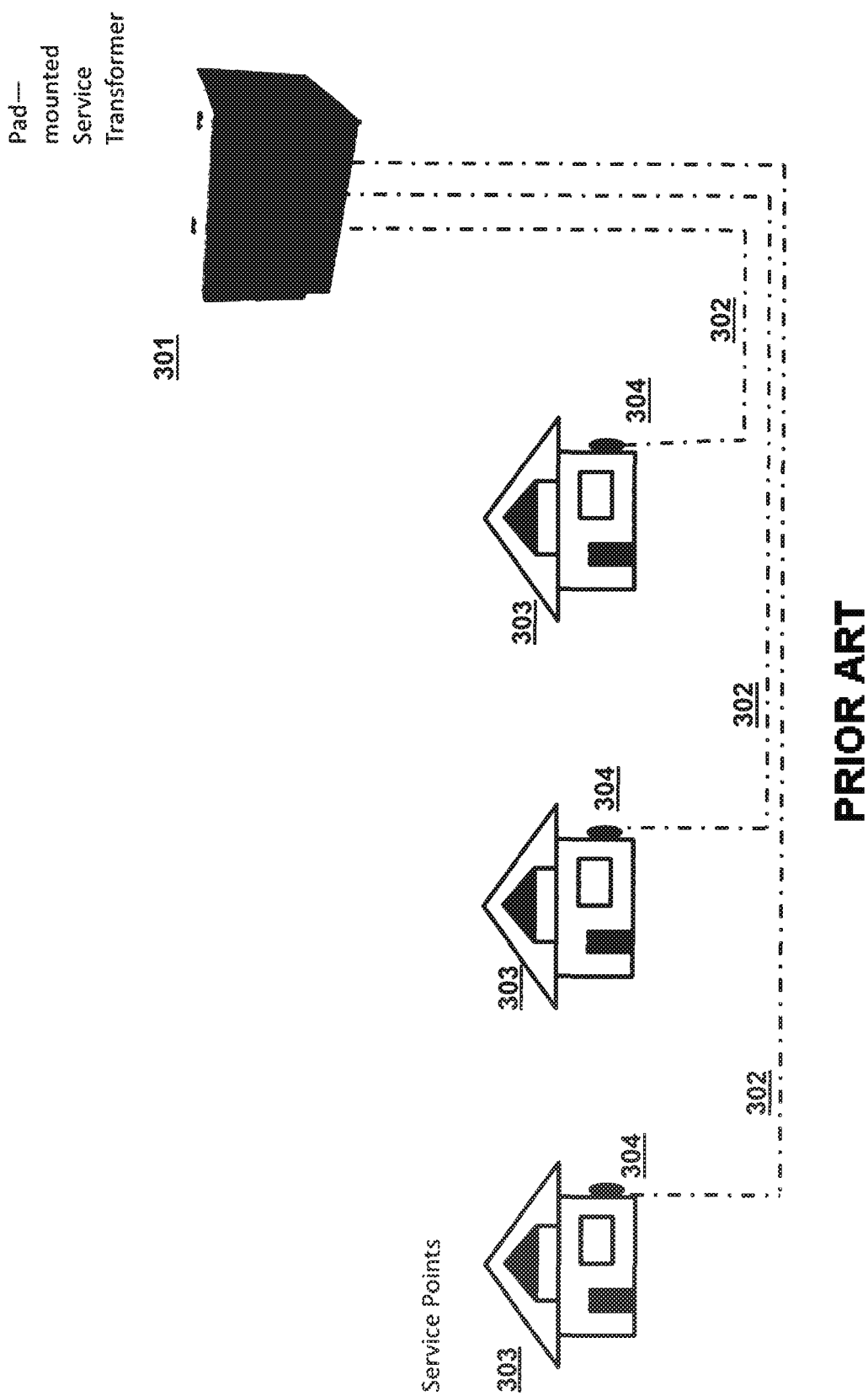
FIG. 3 illustrates a radial-topology transformer area with a pad-mounted transformer, underground power lines, and three metered premises each with its own tap.

Refer to FIG. 1, which illustrates a typical single-phase pole-mounted transformer 101 connected via aerial power lines 102 to residences 103. In the United States and many other locales, this is a typical configuration, especially in older areas. Power lines to residences are typically attached to the eaves of the roof, with the power lines traveling downward to the meters 104 in conduit on the exterior of the residences 103. FIG. 2, by contrast, illustrates a bus topology for the transformer area, which is more typical in other parts of the world than in the United States. In FIG. 2, a pad-mounted transformer 201 connects via a linear buried line 202 connected to residences 203, 204, and 205 at meters 206, 207, and 208 respectively. This topology is common in Europe and elsewhere in the world. A typical installation might serve many more meters than shown: the average number of meters per single-phase transformer in the US is approximately six (6), but the European average is dozens. FIG. 3 shows a typical US buried-cable installation, wherein pad-mounted transformer 301 is connected radially via buried cable 302 to residences 303 at meters 304. These three basic configurations, with minor local variations and multi-phase variations for industrial and commercial applications, represent most electrical distribution networks worldwide. The present invention works with minor variations on all three of these common topologies, as is taught herein below. For the purpose of this teaching, each phase of a three-phase transformer can be considered as a separate TAN, even though, as described in Ser. No. 13/888,102, a three-phase transformer area may actually be organized as a single TAN, but wherein the phase of each node (e.g. Remote) in the TAN is known, and Edge-to-Substation transmissions from the TAN are sent on the phase to which they pertain.

Figure 4:
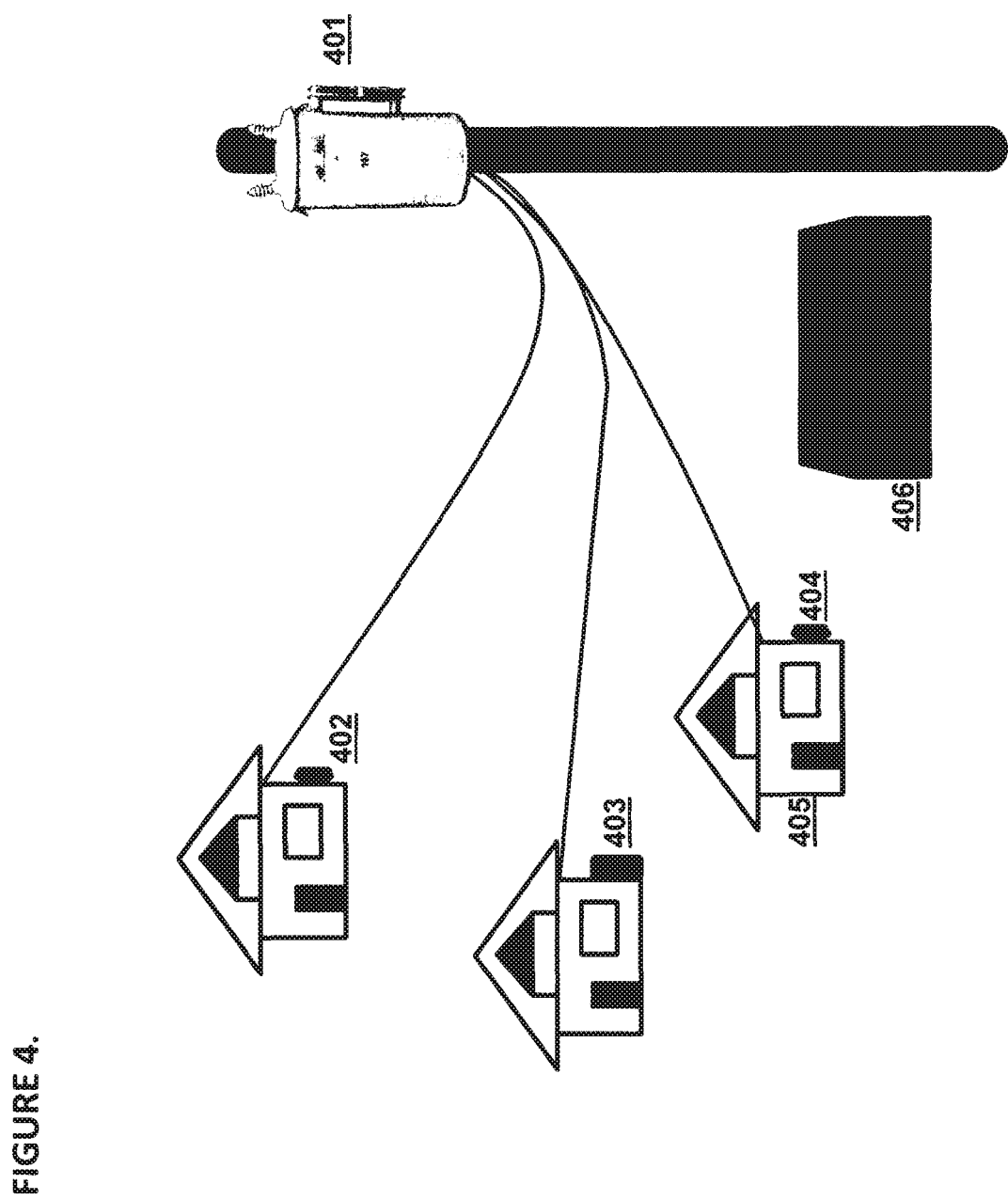
FIG. 4 illustrates the area of FIG. 1 enhanced to form a Transformer Area Network by the addition of a Remote Hub and to Subordinate Remotes.

Refer now to FIG. 4, where the transformer area of FIG. 1 has been converted to a Transformer Area Network by substituting fir the ordinary meters in FIG. 1 two Subordinate Remotes 402 and 404, and one Remote Hub 403. The clocks of the communicating meters of the Transformer Area Network have been synchronized to within a known tolerance, as described in Ser. No. 13/871,944. Service Transformer 401 does not contain any added communication equipment or instruments, and is identical with the Service Transformer of FIG. 1. Note that service point/residence 405 has nearby an unpowered outbuilding 406 such as a barn.

In one embodiment of the invention, a measurement agent resides on each of Remotes 402, 404, and 403. Each agent periodically measures the delivered voltage V and flowing current I at its service point. A monitoring agent which may reside on Remote Hub 403 periodically collects the time-stamped current and voltage measurements from Subordinate Remotes 402 and 404 and from its own measurement agent. The period of the monitoring agent is not required to be the same as the period of the measurement agents, but the time at which the measurements are taken is synchronized to the closest tolerance possible given the capabilities of the TAN. Both periods are very small with respect to the time scale of events in a typical AMI network, wherein, for example, meter readings may be transmitted only every fifteen minutes or even less frequently. The monitoring agent executes a software algorithm that compares current and voltage measurements taken at the different meters at the same time and uses them to infer when an unmetered flow of current is occurring between the transformer and one or more of the metered service points.

Figure 5:
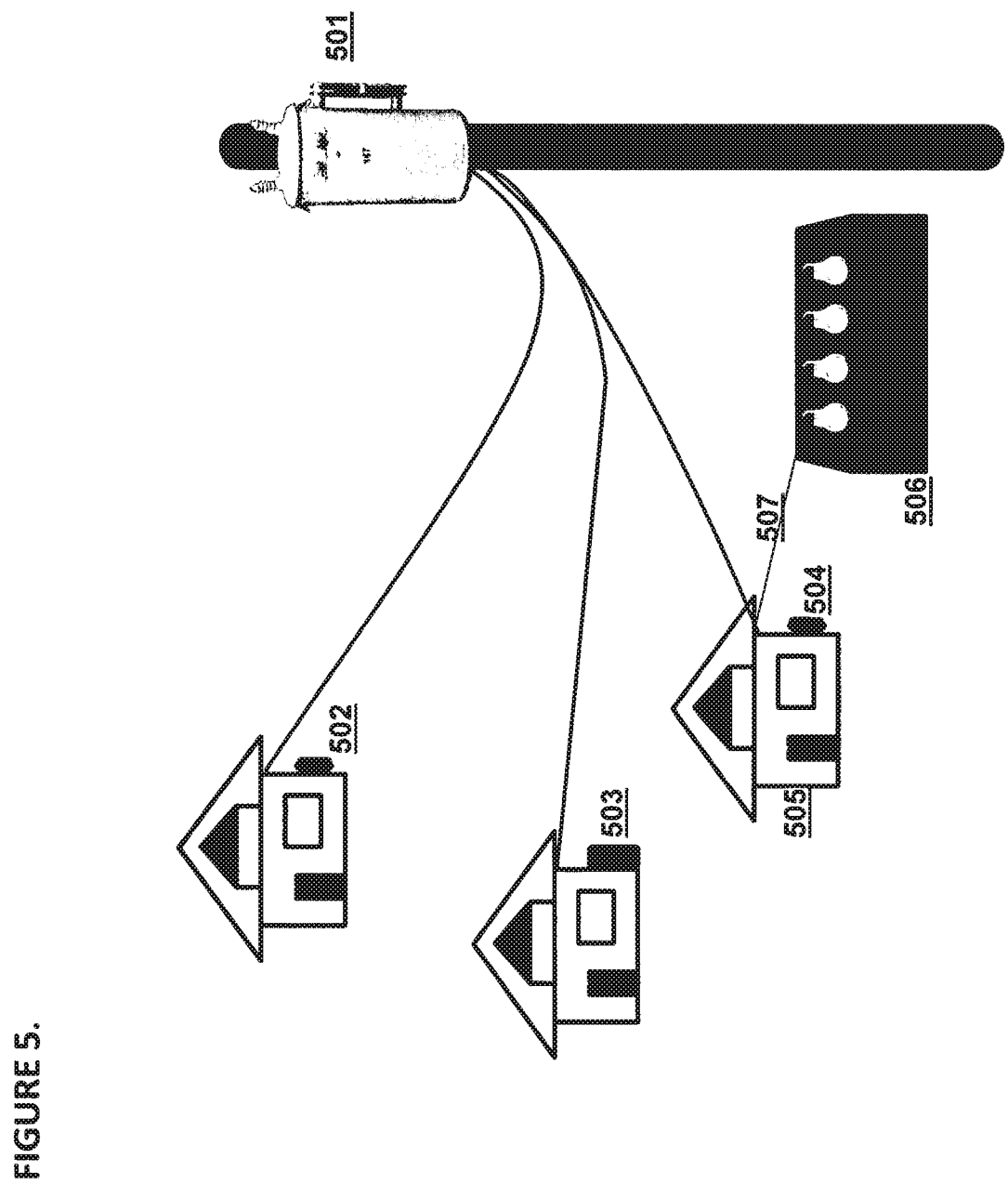
FIG. 5 shows the Transformer Area Network of FIG. 4 with the addition of an illegal unmetered tap used to power a greenhouse.

In FIG. 5, an unmetered tap 507 has been added at premise 505, electrically between transformer 501 and meter 504. The tap has been used to electrify outbuilding 506. Not only do such taps cause monetary losses for the utility, at peak load times they may create a danger of transformer tires and explosions because the TAN as a whole may be drawing more power than the rated maximum of the transformer.

Figure 6:
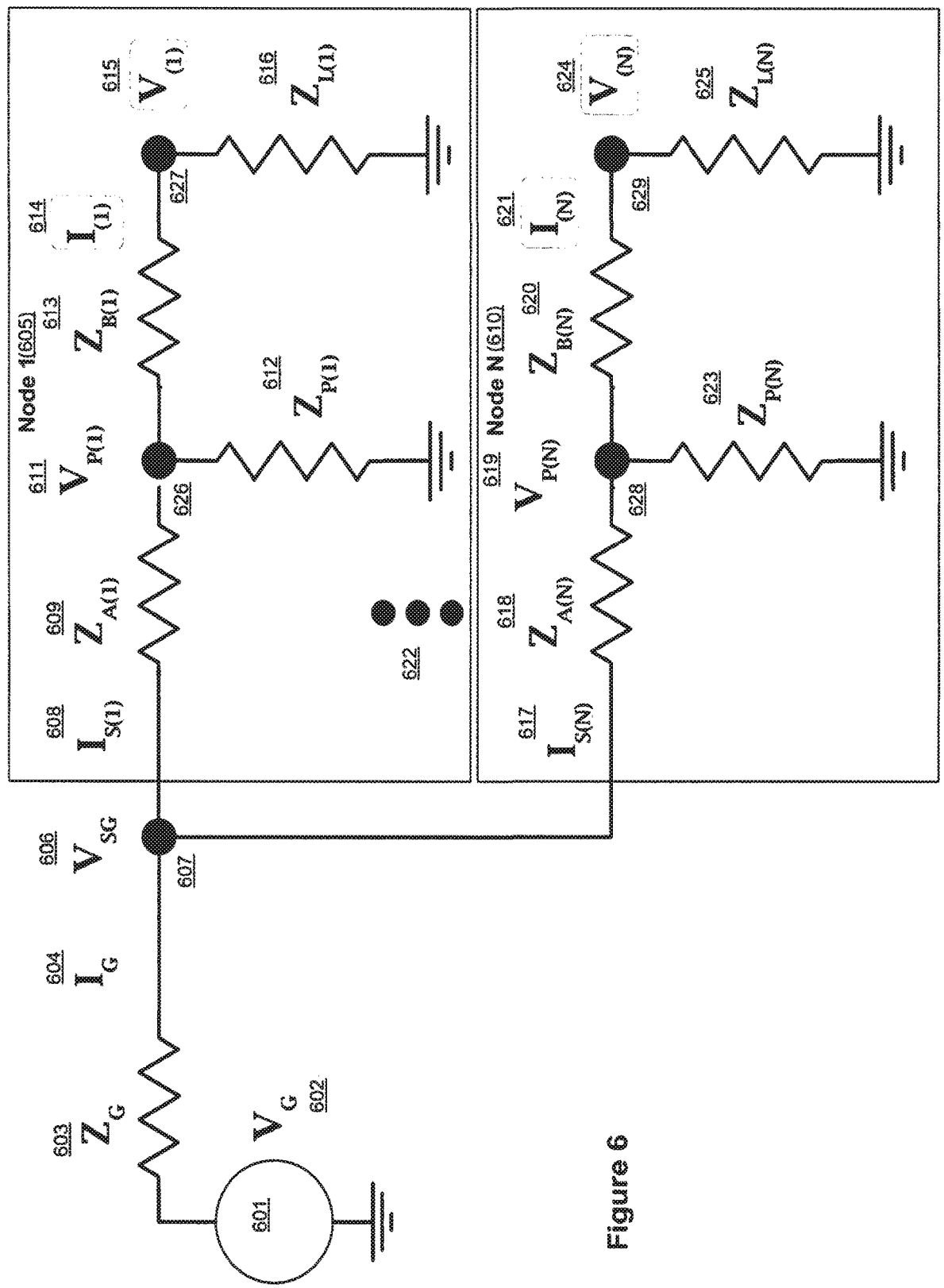
FIG. 6 shows the electrical detail of a radial Transformer Area Network like that of FIGS. 4 and 5, with an arbitrary number of metered premises (Nodes) N.

FIG. 6 provides electrical detail of a radial Transformer Area Network such as that of FIGS. 4 and 5. The TAN of FIG. 6 contains at least two metered service points, or Nodes, herein labeled 1 . . . N. Power source 601 supplies transformer 607 with power at a medium voltage, which is stepped down by transformer 607 to the low voltage range accepted by the meters in the transformer area, here represented by meter 627 in Node 1(605) and meter 629 in Node N(610). Current 604 represents current flowing from the power source due to ail the loads on the grid served by power source 601. Impedance 603 represents the impedance of the medium-voltage grid. The voltage 606 on the low side of transformer 607 fluctuates with changes in voltage 602, impedance 603, and current 604. None of these quantities are constant, measureable, or known to the software agents at the meters (such as 627 and 629), but voltage 602 may be expected to vary around a nominal value within a known range of acceptable values. For example, a typical nominal value for voltage 602 might be 13.4 KV in the United States (though others are possible), and a typical nominal value for voltage 606 might be 240V, though again others are possible. These nominal values may be known to the software agents.

Consider now the components in the rectangle 605 representing Node 1. Node 1 comprises the apparatus delivering power from service transformer 607 to meter 627. Interesting measurable quantities are marked on the diagram. Impedance 616 represents the legitimate metered load of the premise of Node 1, which may vary over time according to what appliances and devices are in use on the premise. Point 626 is not an actual piece of equipment, but represents an arbitrary place on the power line from transformer 607 to meter 627 where an illegal tap might be installed. Impedance 612, which is normally extremely large when no theft is occurring, represents a potential unauthorized, unmetered load. Impedances 609 and 613 represent the normal impedance of the power line from transformer 607 to meter 627. Voltage 611 represents the voltage at hypothetical tap point 626. None of these quantities are known to or measureable by the software agents residing at meter 627. Current 614 and voltage 615 are measured periodically by the measurement agent residing at meter 627 and shared on the TAN by the communication equipment at meter 627. Regardless of the network architecture of the TAN, the sharing is always conducted in such a way that the identity of the meter from which the measurements originate and the time the measurements were taken is known to any receiver of the messages in which the measurements are transmitted. Note that element 622 of FIG. 6 is not a feature of the TAN, but is an ellipsis indicating that an arbitrary number of additional Nodes could exist between Node 1 605 and Node N 610.

Similarly, consider the components its the rectangle 610 representing Node N. This is the apparatus delivering power horn service transformer 607 to meter 629. Impedance 625 represents the legitimate metered load of the premise of Node N, which may vary over owner time according to what appliances and devices are in use on the premise. Point 628 is not actual feature of the TAN, but represents an arbitrary place on the power line from transformer 607 to meter 629 where an illegal tap might be installed. Impedance 623, which is normally extremely large when no theft is occurring, represents a possible unauthorized, unmetered load. Impedances 618 and 620 represent the normal impedance of the power line from transformer 607 to meter 629. Voltage 619 represents the voltage at hypothetical tap point 628. None of these quantities are known to or measureable by the software agents residing at meter 629. Current 621 and voltage 624 are measured periodically by the measurement agent residing at meter 629 and shared on the TAN by the communication equipment at meter 629.

For the purposes of the algorithm of the monitoring agent, it does not matter whether meter 629, meter 627, or the meter of another Node between 1 and N has the Remote Hub and which meters have Subordinate Remotes, Indeed, as is noted herein above, another type of TAN communication entirely may be employed, as long as it provides sufficient bandwidth for all the meters of the TAN to share their measurements within a sufficiently small period. The TAN may host at least one monitoring agent somewhere on the TAN and a measuring agent at each communicating meter. With some network architectures, it may be more effective to host a monitoring agent in every node. Alternatively, the work of the monitoring agent may be distributed among multiple communicating meters. If the monitoring agent does not reside on a meter having the capability to send a wide-area message such as an Edge-to-Substation message, then the monitoring agent must transmit a command to a wide-area enabled device to transmit the anomaly report.

Suppose that an unauthorized load represented by impedance 612 is now attached at point 626. Voltage 611 will drop because more current (the current drawn by the unauthorized load at 612) is flowing through impedance 609. This will also cause a drop in voltage 615. However, the current 614 flowing through impedance 613 does not drop correspondingly. A measurement agent at meter 627, able to measure only current 614 and voltage 615, will not be able to infer whether the drop in voltage 615 is due simply to a drop in voltage 606, or whether it is caused by a theft represented by a drop in voltage 611 and a decrease in impedance 612 (which ought to always be very large). However, consider the observations made by a measurement agent at meter 629. For simplicity, assume that impedance 623 in Node N (610) is properly large no power is being stolen in Node N. A measurement agent at meter 621 will observe a drop in voltage 624 due to the drop in voltage 606. A monitoring agent can use the measured currents 614 and 621 at the meters 627 and 629 respectively (and others, if there are more communicating nodes in the TAN) to estimate the proper voltage drop due to each metered load. Once the effects of the metered loads (616, 624) have been removed, the adjusted magnitudes of the voltages measured at each meter can be compared. Even though there will be small differences in the line impedance between the transformer 607 and each meter, these are expected to be negligible. (In this example, compare impedances 609+613 to meter 627 with impedances 618+620 to meter 629.) If one meter, in this example 627, sees a greater adjusted voltage drop than the other meters, within a tolerance representing normal differences in the line impedance, then it is to be expected that an unmetered load exists between that meter and transformer 607.

Further, this method of comparing current and voltage from each available "viewpoint" detects theft in the TAN even if there are multiple theft points. Even if there were an unmetered load attached between every meter and the transformer, unless the impedances 612, 623, etc. due to unauthorized loads were identical at all times, then the theft points could still be inferred by a monitoring agent with access to the current and voltage measurements of each measurement agent, because the voltage drops at some measurement points would not be proportional to the current at the same point.

When the monitoring agent residing at the Remote Hub of the TAN detects a probable theft, then the Remote Hub may send an Edge-to-Substation message to alert the utility about the anomaly. Edge-to-Substation messages, as described in U.S. patent application Ser. No. 13/871,944 referenced above, travel from a Remote Hub to an electrical distribution substation supplying power to the substation transformer, here, transformer 607. From the substation, the message is transferred by a conventional network to a data center provided by the utility or an energy management services provider. A theft alert may also be propagated via another available network connected to the Remote Hub or other communicating meter, such as an AMI network. Such a message may include at least a unique identifier of the service transformer or a meter at which the anomalous current-voltage relationship was detected which may be used to match the origin of the message with the data in a grid map database.

The method described herein above with minor computational adjustments can be equally applied to a transformer area which has a bus topology such as is shown in FIG. 2 rather than a radial topology like FIGS. 1 and 3. In a bus topology, the voltage drop from transformer to meter is additive as each node is further from the transformer, as the metered loads are connected in series rather than in parallel. Nevertheless, each metered load's contribution to the voltage drop ought to be proportional to the current being drawn at each meter. If the voltage drop at a given meter is greater than proportional to the measured currents between the transformer and that meter, based on the time stamped current and voltage measurements shared on the TAN by the other meters—in this case, specifically the meters earlier in the series with respect to the transformer than the given measurement point.

In order to apply this method in a TAN with a bus topology, it is necessary for the order of the nodes in the TAN with respect to the transformer to be known to the monitoring agent (at least). This can be inferred by the monitoring agent. The ordering of the series will correspond to the measured voltage at each metered point, with the lowest voltage being schematically furthest from the transformer. Referring again to FIG. 2, the schematically nearest meter to transformer 201 is 206, and the furthest in series is 208. This would remain true even if premise 205 were geospatiaily closer to transformer 201 than premise 203, which is certainly possible. This condition is also illustrated in FIG. 2. Additionally, this schematic inference remains correct even if power theft is occurring, because the resulting voltage drops are still cumulative.

U.S. patent application Ser. Nos. 13/871,944, 13/888,102, and 13/911,849, all referenced above, teach methods for recording an accurate grid map of an electrical distribution network. The grid mapping method taught by these inventions includes the feeder and phase of each substation operable to power each metered load supplied by the network and a correct and current partitioning of the meters of the network into Transformer Area Networks. In order to perform theft detection, the grid map of a TAN with a bus topology may be augmented with the series order of the meters of the TAN, and this order can be kept up-to-date as meters and loads are added and removed from the TAN. For theft detection, this information may only need to be maintained by a monitoring agent in each TAN, and indeed it may be recomputed periodically by each monitoring agent. However, it may be beneficial to record this additional information in a centralized grid map database, said centralized grid map database being taught by Ser. No. 13/871,944. To do this, the Edge-to-Substation message sent when a new node is discovered in the TAN may include the schematic order of the meter on the power line bus from the transformer. Similarly, if the order of nodes were observed to change, for example after a power outage or extension of the TAN due to construction, then the new ordering might be reported in an Edge-to-Substation message to be recorded in a grid map database.

Another method of power theft is sometimes used that does not involve creating an illegal tap. This method involves creating misdirection by switching meters with a neighbor prior to making an increase in consumption. A communicating meter of any kind can already be enabled to report being disconnected from the meter socket if it is plugged into a meter socket again (whether the same socket or a different one) while power is available. However, an enterprising power thief can wait for a natural power outage in which to swap meters with another premise, or can vandalize the network to create an outage in which to effect the swap. An intelligent meter, however, that participates in a Transformer Area Network with real-time grid mapping as is described herein and in the referenced related inventions, can detect an illegal move in a variety of ways:

If two meters are swapped between two distinct TANs, then both TANs may report discovering a new meter and losing communications with a meter that was formerly part of the TAN.

If two meters are swapped in such a way that the phase of the meters is reversed, then this change may be reported by the grid mapping agents.

If two meters are switched within the same TAN and the same phase, then it the TAN has a bus architecture, both meters will be detected as having changed positions with respect to their service transformer, and this may be reported by the monitoring agent.

If a meter has access to a geospatial location signal, then a grid mapping agent on the meter may report the change in location.

This leaves only one case swapping two meters not enabled to receive a geospatial location signal, between two premises on the same phase of the same radial TAN—which is not easily detected. This case may be undesirable from the viewpoint of the thief because of the proximity of the premises better to tamper with a meter socket several blocks away than with that of the next-door neighbor.

Figure 7:
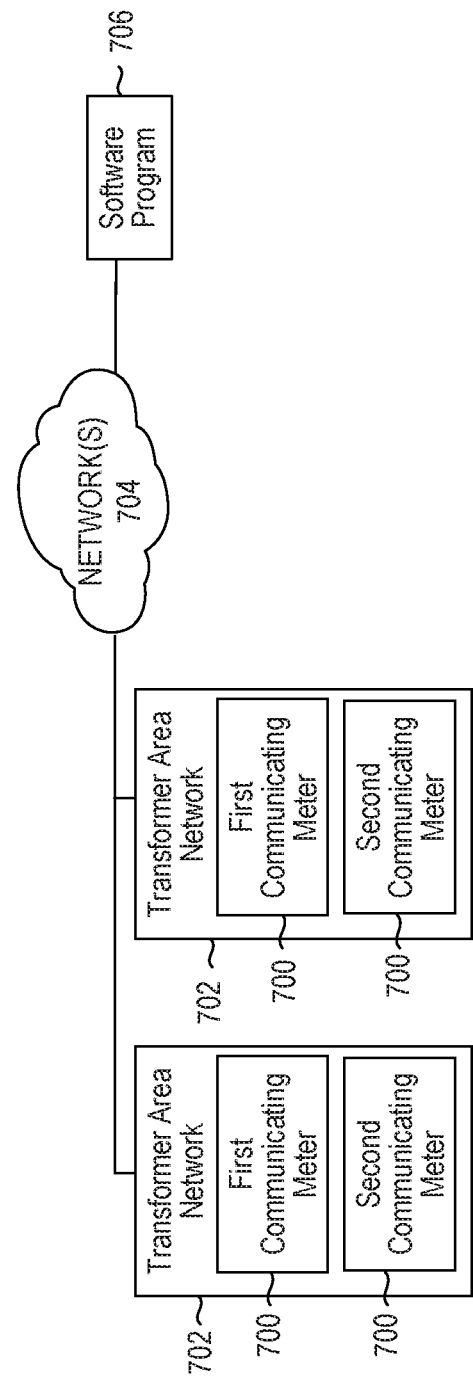
FIG. 7 is a schematic diagram of a system of the present disclosure.

Referring to FIG. 7, to manage the detection process, an agent such as the monitoring agent on at least one communicating meter 700 (such as a Remote Hub) on each TAN 702 may report each of the detected anomalous conditions using an Edge-to-Substation message or another available wide-area network 704 capable of forwarding the message to a software program 706 residing in a data center with access to the consolidated grid map. The software program 706 also receives reports of planned grid changes from other applications used to manage the grid. An example of such reports could be the work orders used to dispatch field engineers to make required changes and repairs to the distribution grid. The software program 706 avoids reporting false theft indications by matching the anomaly reports from the communicating meters 700 against the work orders or similar reports. Anomalies which are explained by the work orders are not reported as potential indicators of theft. The anomalies which cannot be matched with a work order create alerts that a potential theft may be occurring, regardless of whether the anomaly is a change in the grid map or a voltage anomaly reported by a monitoring agent. The theft alert may contain the account numbers and addresses of the affected premises, the identity and geospatial coordinates of the affected transformers and meters, and any other relevant information that may be used to locate the theft, whether the theft is perpetrated by means of moving meters or by means of creating an unauthorized, unmetered tap.

The foregoing description of the invention has been presented for purposes of illustration and description and is not intended to be exhaustive or to limit the invention to the precise forms disclosed. Many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A method comprising:
   receiving, by a computing device, notifications from one or more utility applications regarding planned hardware changes in one of a plurality of Transformer Area Networks of an electrical distribution network associated with a grid mapping database, the one of a plurality of Transformer Area Networks comprising a first communicating meter and a second communicating meter, the first communicating meter comprising a Measurement Agent and a Monitoring Agent, the Measurement Agent configured to periodically measure and record a current, a voltage, and a time, the Monitoring Agent configured to receive and compare current and voltage measurements taken at different meters at a same time;
   receiving, by the first communicating meter comprising a processor device via the one of a plurality of Transformer Area Networks, a short-range on-grid transmission from the second communicating meter, the first communicating meter and the second communicating meter coupled to the electrical distribution network on a low-voltage side of a service transformer;
   detecting, by the first communicating meter of the one of a plurality of Transformer Area Networks, an anomalous condition based on the short-range on-grid transmission from the second communicating meter;
   transmitting, by the first communicating meter, a long-range on-grid message to the computing device, that identifies a detected hardware change based on the detected anomalous condition within the one of a plurality of Transformer Area Networks of the electrical distribution network;
   determining, by the computing device, that the detected hardware change is not identified in the notifications regarding the one of a plurality of Transformer Area Networks; and
   initiating, by the computing device, an alert that identifies the detected hardware change.

2. The method of claim 1, wherein the long-range on-grid message identifying the detected hardware change indicates an identity and a grid location of a new meter joining the one of a plurality of Transformer Area Networks.

3. The method of claim 1, wherein the long-range on-grid message identifying the detected hardware change indicates that a meter has stopped communicating with the one of a plurality of Transformer Area Networks, the long-range on-grid message identifying the meter, and wherein the alert includes an identity and a grid location of the meter.

4. The method of claim 1, wherein the long-range on-grid message identifying the detected hardware change indicates that a meter has changed location within the one of a plurality of Transformer Area Networks, the long-range on-grid message identifying the meter, and wherein the alert includes a message reporting that a schematic location of the meter within a bus-structured Transformer Area Network has changed.

5. The method of claim 1, wherein the long-range on-grid message identifying the detected hardware change indicates that a geospatial location of a meter has changed.

6. The method of claim 1, wherein the long-range on-grid message identifying the detected hardware change indicates that a power theft due to an unauthorized, unmetered tap may be occurring in the one of a plurality of Transformer Area Networks.

7. The method of claim 1, wherein the anomalous condition comprises an anomalous electrical condition.

8. The method of claim 1, wherein the anomalous condition comprises an anomalous current-voltage relationship.

9. The method of claim 1, wherein the anomalous condition comprises the one of a plurality of Transformer Area Networks reporting losing communication with a former meter and discovering a new meter.

10. The method of claim 1, wherein the anomalous condition comprises a phase change measured by the second communicating meter.

11. The method of claim 1, wherein the anomalous condition comprises a change in position of the second communicating meter relative to the service transformer.

12. The method of claim 1, wherein the anomalous condition comprises a change in location of the second communicating meter based on a geospatial location signal.

13. The method of claim 1, wherein the long-range on-grid message comprises an Edge-to-Substation message.

14. A system, comprising:
    a first communicating meter on a low voltage side of a service transformer, the first communicating meter comprising a processor device configured to:
       receive, by the first communicating meter via a one of a plurality of Transformer Area Networks of an electrical distribution network, a short-range on-grid transmission from a second communicating meter, the first communicating meter and the second communicating meter coupled to the electrical distribution network on a low-voltage side of the service transformer, the one of a plurality of Transformer Area Networks comprising the first communicating meter and the second communicating meter, the first communicating meter comprising a Measurement Agent and a Monitoring Agent, the Measurement Agent configured to periodically measure and record a current, a voltage, and a time, the Monitoring Agent configured to receive and compare current and voltage measurements taken at different meters at a same time;
       detect, by the first communicating meter of the one of a plurality of Transformer Area Networks, an anomalous condition based on the short-range on-grid transmission from the second communicating meter; and transmit, by the first communicating meter, a long-range on-grid message that identifies a detected hardware change based on the detected anomalous condition within the one of a plurality of Transformer Area Networks of the electrical distribution network; and a computing device comprising:
a communication interface configured to communicate with a network; and
a processor coupled to the communication interface and configured to:
receive notifications from one or more utility applications regarding planned hardware changes in the one of a plurality of Transformer Area Networks of the electrical distribution network associated with a grid mapping database;
receive the long-range on-grid message originated by the first communicating meter;
determine that the detected hardware change is not identified in the notifications regarding the one of a plurality of Transformer Area Networks; and
initiate an alert that identifies the detected hardware change.

15. The system of claim 14, wherein the long-range on-grid message identifying the detected hardware change indicates an identity and a grid location of a new meter joining the one of a plurality of Transformer Area Networks.

16. The system of claim 14, wherein the long-range on-grid message identifying the detected hardware change indicates that a meter has stopped communicating with the one of a plurality of Transformer Area Networks, the long-range on-grid message identifying the meter, and wherein the alert includes an identity and a grid location of the meter.

17. The system of claim 14, wherein the long-range on-grid message identifying the detected hardware change indicates that a meter has changed location within the one of a plurality of Transformer Area Networks, the long-range on-grid message identifying the meter, and wherein the alert includes a message reporting that a schematic location of the meter within a bus-structured Transformer Area Network has changed.

18. The system of claim 14, wherein the long-range on-grid message identifying the detected hardware change indicates that a geospatial location of a meter has changed.

19. The system of claim 14, wherein the long-range on-grid message identifying the detected hardware change indicates that a power theft due to an unauthorized, unmetered tap may be occurring in the one of a plurality of Transformer Area Networks.

20. The system of claim 14, wherein the anomalous condition comprises an anomalous electrical condition.

21. The system of claim 14, wherein the anomalous condition comprises an anomalous current-voltage relationship.

22. The system of claim 14, wherein the anomalous condition comprises the one of a plurality of Transformer Area Networks reporting losing communication with a former meter and discovering a new meter.

23. The system of claim 14, wherein the anomalous condition comprises a phase change measured by the second communicating meter.

24. The system of claim 14, wherein the anomalous condition comprises a change in position of the second communicating meter relative to the service transformer.

25. The system of claim 14, wherein the anomalous condition comprises a change in location of the second communicating meter based on a geospatial location signal.

26. The system of claim 14, wherein the long-range on-grid message comprises an Edge-to-Substation message.

* * * * *